United States Patent
Hirota et al.

(10) Patent No.: US 9,574,905 B2
(45) Date of Patent: Feb. 21, 2017

(54) ROTATING FIELD SENSOR AND ANGLE DETERMINATION METHOD USING THE SAME

(71) Applicant: TDK CORPORATION, Tokyo (JP)

(72) Inventors: Yohei Hirota, Tokyo (JP); Hiraku Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 341 days.

(21) Appl. No.: 14/499,891

(22) Filed: Sep. 29, 2014

(65) Prior Publication Data

US 2015/0204696 A1 Jul. 23, 2015

(30) Foreign Application Priority Data

Jan. 20, 2014 (JP) .................. 2014-007573

(51) Int. Cl.
*G01B 7/30* (2006.01)
*G01D 5/16* (2006.01)
*G01D 5/14* (2006.01)
*G01R 33/09* (2006.01)

(52) U.S. Cl.
CPC ............... *G01D 5/16* (2013.01); *G01D 5/145* (2013.01); *G01R 33/09* (2013.01)

(58) Field of Classification Search
CPC ............ G01D 5/16; G01D 5/145; G01R 33/09
See application file for complete search history.

(56) References Cited

U.S. PATENT DOCUMENTS

2012/0038351 A1* 2/2012 Saruki .................. G01R 33/091
324/207.25
2012/0053865 A1 3/2012 Saruki et al.

FOREIGN PATENT DOCUMENTS

| JP | 2007-017385 A | 1/2007 |
| JP | 2010-019575 A | 1/2010 |
| JP | 2012-021842 A | 2/2012 |

OTHER PUBLICATIONS

Jun. 24, 2015 Office Action issued in Japanese Patent Application No. 2014-007573.

* cited by examiner

*Primary Examiner* — Jay Patidar
(74) *Attorney, Agent, or Firm* — Oliff PLC

(57) ABSTRACT

A rotating field sensor includes four detection circuits each of which generates an output signal responsive to the direction of a rotating magnetic field, and an angle calculation unit configured to calculate four angle values in correspondence to four groups each consisting of two detection circuits selected from the four detection circuits. The angle calculation unit calculates each of the four angle values on the basis of two output signals of the two detection circuits constituting a corresponding one of the four groups.

21 Claims, 14 Drawing Sheets

ROTATING FIELD SENSOR AND ANGLE DETERMINATION METHOD USING THE SAME

BACKGROUND OF THE INVENTION

1. Field of the Invention

The present invention relates to a rotating field sensor for detecting an angle that the direction of a rotating magnetic field forms with respect to a reference direction, and to an angle determination method using the rotating field sensor.

2. Description of the Related Art

In recent years, rotating field sensors have been widely used to detect the rotational position of an object in various applications such as detecting the rotational position of an automotive steering wheel. Systems using rotating field sensors are typically provided with means (for example, a magnet) for generating a rotating magnetic field whose direction rotates in response to the rotation of the object. The rotating field sensors use magnetic detection elements to detect the angle that the direction of the rotating magnetic field forms with respect to a reference direction. The rotational position of the object is thus detected.

Among known rotating field sensors is one that includes two bridge circuits (Wheatstone bridge circuits), as described in U.S. Patent Application Publication No. 2012/0053865 A1. In the rotating field sensor disclosed therein, each of the two bridge circuits includes four magnetic detection elements and outputs a signal responsive to the direction of the rotating magnetic field. The output signals of the two bridge circuits are different in phase from each other by ¼ the period of the output signals of the bridge circuits. The output signals of the two bridge circuits are used as a basis for determining an angle detection value which corresponds to the angle that the direction of the rotating magnetic field forms with respect to a reference direction.

U.S. Patent Application Publication No. 2012/0053865 A1 discloses a technique for determining an angle detection value with a reduced error by providing four detection circuits each of which includes a bridge circuit and performing an arithmetic operation using the output signals of the four detection circuits.

A known magnetic detection element for use in a bridge circuit is a magnetoresistive (MR) element that is formed by serially connecting a plurality of MR films each of which exhibits a magnetoresistive effect, as disclosed in U.S. Patent Application Publication No. 2012/0053865 A1, for example.

In the case of a rotating field sensor including two bridge circuits as described above, the determined angle detection value is no longer correct if at least one of the two bridge circuits fails.

U.S. Patent Application Publication No. 2012/0053865 A1 discloses a method including monitoring the resistances of the bridge circuits, the potentials at two output ports of each bridge circuit, the magnitude of a signal corresponding to a potential difference between the two output ports, or the like. According to the method, a bridge circuit is determined to be in failure if the monitored value exceeds a predetermined range of the normal value.

The foregoing method is able to detect such a failure of a bridge circuit that the monitored value deviates greatly from the normal value due to, for example, the occurrence of a break in any location in the bridge circuit or the occurrence of a short circuit across a magnetic detection element. Disadvantageously, however, the foregoing method is not able to detect such a failure of a bridge circuit that the monitored value deviates from the normal value by a relatively small amount. Such a failure can occur, for example, when one of the plurality of MR films connected in series to constitute an MR element is short-circuited or when the plurality of MR films become anisotropic.

U.S. Patent Application Publication No. 2012/0053865 A1 further discloses a technique for determining, in the case of a failure of one of the four bridge circuits, the angle detection value by an arithmetic operation using the output signals of two of the four bridge circuits other than the failed bridge circuit. This technique, however, is not able to detect such a failure of a bridge circuit that the monitored value deviates from the normal value by a relatively small amount, as described above. If such a failure occurs, it is not possible to identify two bridge circuits that are other than the failed bridge circuit, and consequently, it is not possible to determine a correct angle detection value.

The descriptions so far have dealt with the problem with a rotating field sensor that determines an angle detection value by using the output signals of two bridge circuits. However, the foregoing problem applies to all rotating field sensors that include a plurality of detection circuits each configured to output a signal responsive to the direction of a rotating magnetic field.

OBJECT AND SUMMARY OF THE INVENTION

It is an object of the present invention to provide a rotating field sensor including a plurality of detection circuits each configured to output a signal responsive to the direction of a rotating magnetic field, the rotating field sensor being enabled to output a correct angle detection value even if one of the detection circuits fails, and to provide an angle determination method using such a rotating field sensor.

A rotating field sensor of the present invention is for detecting an angle that the direction of a rotating magnetic field in a reference position forms with respect to a reference direction. The rotating field sensor includes n detection circuits. Each of the n detection circuits includes at least one magnetic detection element and generates an output signal responsive to the direction of the rotating magnetic field. The rotating field sensor further includes an angle calculation unit configured to calculate g angle values in correspondence to g groups each consisting of m detection circuits selected from the n detection circuits. Each of the g angle values has a correspondence relationship with the angle that the direction of the rotating magnetic field in the reference position forms with respect to the reference direction. Here, m is an integer not less than two, n is an integer greater than m by two or more, and g is an integer not less than three and not more than $_nC_m$. The angle calculation unit is configured to calculate each of the g angle values on the basis of m output signals of the m detection circuits constituting a corresponding one of the g groups. Each of the n detection circuits is used to constitute at least one and not more than (g−2) of the g groups.

The rotating field sensor of the present invention may further include an angle determination unit configured to determine, by using the g angle values, an angle detection value to be output from the rotating field sensor, the angle detection value having a correspondence relationship with the angle that the direction of the rotating magnetic field in the reference position forms with respect to the reference direction.

In the case of a failure of one of the n detection circuits, the angle determination unit may extract from the g angle values a plurality of correct angle values corresponding to a plurality of ones of the g groups that do not include the failed detection circuit, and determine the angle detection value on the basis of at least one of the plurality of correct angle values. In this case, the angle determination unit may include an angle difference calculation unit and a determination unit. The angle difference calculation unit is configured to calculate at least g angle differences for respective at least g angle value pairs each consisting of two angle values selected from the g angle values. Each of the at least g angle differences is a difference between the two angle values constituting a corresponding one of the at least g angle value pairs. The determination unit is configured to extract one or more angle differences that fall within a predetermined range from the at least g angle differences, and to determine a plurality of angle values constituting one or more angle value pairs corresponding to the extracted one or more angle differences to be the plurality of correct angle values. In this case, each of the g angle values is used to constitute at least two of the at least g angle value pairs.

The angle determination unit may be configured to determine the angle detection value repeatedly at predetermined time intervals, and to generate an estimated value for a next-to-be-determined angle detection value on the basis of a plurality of angle detection values already determined. In the case of a failure of one of the n detection circuits, if a plurality of correct angle values corresponding to a plurality of ones of the g groups that do not include the failed detection circuit are identifiable from the g angle values, the angle determination unit may determine the angle detection value on the basis of at least one of the plurality of correct angle values, and if the plurality of correct angle values are not identifiable from the g angle values, the angle determination unit may determine the estimated value to be the angle detection value.

In the aforementioned case, the angle determination unit may include an angle difference calculation unit, a provisional normal angle value determination unit, and an angle output unit. The angle difference calculation unit is configured to calculate at least g angle differences for respective at least g angle value pairs each consisting of two angle values selected from the g angle values, each of the at least g angle differences being a difference between the two angle values constituting a corresponding one of the at least g angle value pairs. The provisional normal angle value determination unit is configured to extract one or more angle differences that fall within a predetermined range from the at least g angle differences, and to determine a plurality of angle values constituting one or more angle value pairs corresponding to the extracted one or more angle differences to be a plurality of provisional normal angle values. The angle output unit is configured to determine and output the angle detection value repeatedly at predetermined time intervals. The angle output unit may include: an angle value estimation unit configured to generate the aforementioned estimated value; and an angle detection value determination unit configured to, in the case of a failure of one of the n detection circuits, determine the angle detection value on the basis of at least one of the aforementioned plurality of correct angle values if the plurality of correct angle values are identifiable from the plurality of provisional normal angle values, and determine, if the plurality of correct angle values are not identifiable from the plurality of provisional normal angle values, the estimated value to be the angle detection value. In this case, each of the g angle values is used to constitute at least two of the at least g angle value pairs.

In the rotating field sensor of the present invention, g may be greater than m by two or more, and be not less than (n−m+1). The g groups may be formed of such combinations of detection circuits that in the case of a failure of whichever one of the n detection circuits, there is no detection circuit other than the failed detection circuit that is included in all ones of the g groups that include the failed detection circuit and included in none of the other ones of the g groups. In this case, the rotating field sensor may further include a failure detection unit configured to, in the case of a failure of one of the n detection circuits, extract from the g angle values all incorrect angle values corresponding to all the ones of the g groups that include the failed detection circuit, and identify a detection circuit that is included in all ones of the g groups that correspond to all the incorrect angle values and included in none of ones of the g groups that correspond to any angle values other than all the incorrect angle values as the failed detection circuit.

The failure detection unit may be configured to determine an angle detection value to be output from the rotating field sensor on the basis of one or more angle values other than all the incorrect angle values, the angle detection value having a correspondence relationship with the angle that the direction of the rotating magnetic field in the reference position forms with respect to the reference direction.

The failure detection unit may include an angle difference calculation unit and a failure determination unit. The angle difference calculation unit is configured to calculate at least g angle differences for respective at least g angle value pairs each consisting of two angle values selected from the g angle values, each of the at least g angle differences being a difference between the two angle values constituting a corresponding one of the at least g angle value pairs. The failure determination unit is configured to identify the failed detection circuit on the basis of the at least g angle differences. In this case, each of the g angle values is used to constitute at least two of the at least g angle value pairs. The failure determination unit is configured to extract all angle differences that fall within a predetermined range from the at least g angle differences, and to determine all angle values that are not included in any of all angle value pairs corresponding to all the extracted angle differences to be all the incorrect angle values.

An angle determination method of the present invention is a method for determining an angle detection value by using a rotating field sensor. The angle detection value has a correspondence relationship with the angle that the direction of a rotating magnetic field in a reference position forms with respect to a reference direction. The rotating field sensor includes n detection circuits. Each of the n detection circuits includes at least one magnetic detection element and generates an output signal responsive to the direction of the rotating magnetic field.

The angle determination method of the present invention includes a first step and a second step. The first step calculates g angle values in correspondence to g groups each consisting of m detection circuits selected from the n detection circuits. Each of the g angle values has a correspondence relationship with the angle that the direction of the rotating magnetic field in the reference position forms with respect to the reference direction. The second step determines the angle detection value by using the g angle values. Here, m is an integer not less than two, n is an integer greater than m by two or more, and g is an integer not less than three and not more than $_nC_m$. The first step calculates each of the g angle values on the basis of m output signals of the m detection circuits constituting a corresponding one of the g groups. Each of the n detection circuits is used to constitute at least one and not more than (g−2) of the g groups.

In the angle determination method of the present invention, the second step may, in the case of a failure of one of the n detection circuits, extract from the g angle values a plurality of correct angle values corresponding to a plurality of ones of the g groups that do not include the failed detection circuit, and determine the angle detection value on the basis of at least one of the plurality of correct angle values. In this case, the second step may include: a step of calculating at least g angle differences for respective at least g angle value pairs each consisting of two angle values selected from the g angle values, each of the at least g angle differences being a difference between the two angle values constituting a corresponding one of the at least g angle value pairs; and a step of extracting one or more angle differences that fall within a predetermined range from the at least g angle differences, and determining a plurality of angle values constituting one or more angle value pairs corresponding to the extracted one or more angle differences to be the plurality of correct angle values. In this case, each of the g angle values is used to constitute at least two of the at least g angle value pairs.

In the angle determination method of the present invention, the second step may determine the angle detection value repeatedly at predetermined time intervals, and generate an estimated value for a next-to-be-determined angle detection value on the basis of a plurality of angle detection values already determined. In the case of a failure of one of the n detection circuits, the second step may determine the angle detection value on the basis of at least one of a plurality of correct angle value corresponding to a plurality of ones of the g groups that do not include the failed detection circuit if the plurality of correct angle values are identifiable from the g angle values, or may determine the estimated value to be the angle detection value if the plurality of correct angle values are not identifiable from the g angle values.

In the aforementioned case, the second step may include: a step of calculating at least g angle differences for respective at least g angle value pairs each consisting of two angle values selected from the g angle values, each of the at least g angle differences being a difference between the two angle values constituting a corresponding one of the at least g angle value pairs; a step of extracting one or more angle differences that fall within a predetermined range from the at least g angle differences, and determining a plurality of angle values constituting one or more angle value pairs corresponding to the extracted one or more angle differences to be a plurality of provisional normal angle values; and an angle detection value determination step of determining the angle detection value repeatedly at predetermined time intervals. The angle detection value determination step may include: a step of generating the estimated value; and a step of, in the case of a failure of one of the n detection circuits, determining the angle detection value on the basis of at least one of the plurality of correct angle values if the plurality of correct angle values are identifiable from the plurality of provisional normal angle values, or determining the estimated value to be the angle detection value if the plurality of correct angle values are not identifiable from the plurality of provisional normal angle values. In this case, each of the g angle values is used to constitute at least two of the at least g angle value pairs.

In the angle determination method of the present invention, g may be larger than m by two or more, and be not less than (n−m+1). The g groups may be formed of such combinations of detection circuits that in the case of a failure of whichever one of the n detection circuit, there is no detection circuit other than the failed detection circuit that is included in all ones of the g groups that include the failed detection circuit and included in none of the other ones of the g groups. In this case, the second step may, in the case of a failure of one of the n detection circuits, extract from the g angle values all incorrect angle values corresponding to all the ones of the g groups that include the failed detection circuit, and identify a detection circuit that is included in all ones of the g groups that correspond to all the incorrect angle values and included in none of ones of the g groups that correspond to any angle values other than all the incorrect angle values as the failed detection circuit. In this case, the second step may determine the angle detection value on the basis of one or more angle values other than all the incorrect angle values.

The second step may include: a step of calculating at least g angle differences for respective at least g angle value pairs each consisting of two angle values selected from the g angle values, each of the at least g angle differences being a difference between the two angle values constituting a corresponding one of the at least g angle value pairs; and a step of identifying the failed detection circuit on the basis of the at least g angle differences. In this case, each of the g angle values is used to constitute at least two of the at least g angle value pairs. The step of identifying the failed detection circuit may extract all angle differences that fall within a predetermined range from the at least g angle differences, and determine all angle values that are not included in any of all angle value pairs corresponding to all the extracted angle differences to be all the incorrect angle values.

In the rotating field sensor and the angle detection method of the present invention, the at least one magnetic detection element may be at least one magnetoresistive element including: a magnetization pinned layer whose magnetization direction is pinned; a free layer whose magnetization direction varies depending on the direction of the rotating magnetic field; and a nonmagnetic layer disposed between the magnetization pinned layer and the free layer.

With the rotating field sensor of the present invention, even if one of the n detection circuits fails, a plurality of angle values corresponding to a plurality of ones of the g groups that do not include the failed detection circuit are correct angle values among the g angle values. The plurality of correct angle values are identical with or very close to each other, and are thus extractable. The angle detection value is determinable on the basis of at least one of the plurality of correct angle values. Consequently, according to the present invention, the rotating field sensor including a plurality of detection circuits each configured to output a signal responsive to the direction of the rotating magnetic field is able to output a correct angle detection value even if one of the detection circuits fails.

According to the angle determination method of the present invention, g angle values are calculated in correspondence to g groups of detection circuits, and the angle detection value is determined by using the g angle values. As described above, even if one of the n detection circuits fails, a plurality of angle values corresponding to a plurality of ones of the g groups that do not include the failed detection circuit are correct angle values among the g angle values. Consequently, according to the present invention, by using the rotating field sensor including a plurality of detection circuits each configured to output a signal responsive to the direction of the rotating magnetic field, it becomes possible to determine a correct angle value even if one of the detection circuits fails.

Other and further objects, features and advantages of the present invention will appear more fully from the following description.

DETAILED DESCRIPTION OF THE PREFERRED EMBODIMENTS

First Embodiment

Figure 1:
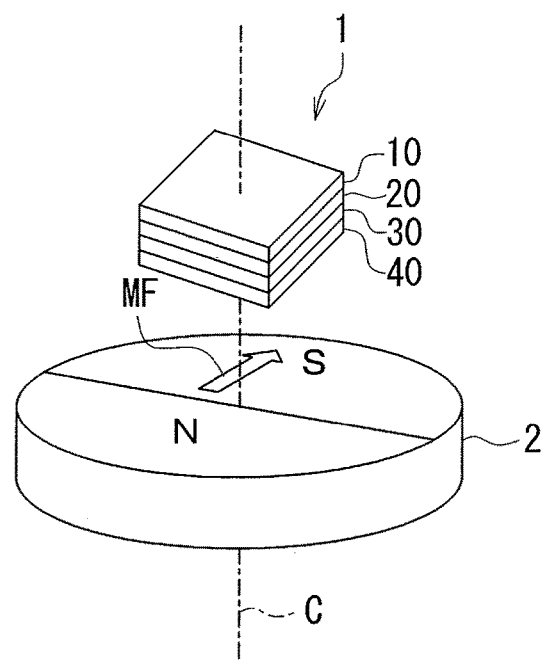
FIG. 1 is a perspective view illustrating the general configuration of a rotating field sensor according to a first embodiment of the invention.
Figure 2:
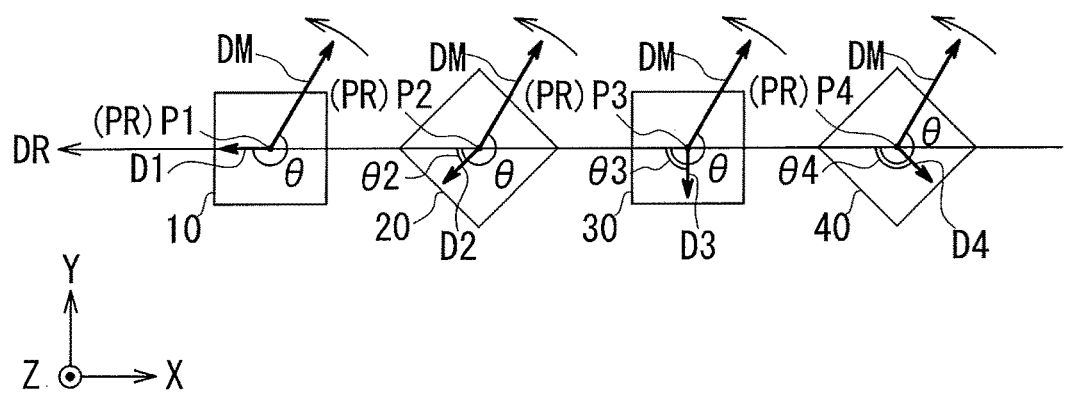
FIG. 2 is an explanatory diagram illustrating the definitions of directions and angles used in the first embodiment of the invention.

Preferred embodiments of the present invention will now be described in detail with reference to the drawings. First, reference is made to FIG. 1 and FIG. 2 to describe the general configuration of a rotating field sensor according to a first embodiment of the invention. FIG. 1 is a perspective view illustrating the general configuration of the rotating field sensor according to the first embodiment. FIG. 2 is an explanatory diagram illustrating the definitions of directions and angles used in the first embodiment.

As shown in FIG. 1, the rotating field sensor 1 according to the first embodiment is configured to detect the angle that the direction of a rotating magnetic field MF in a reference position forms with respect to a reference direction. The direction of the rotating magnetic field MF in the reference position rotates when viewed from the rotating field sensor 1. In FIG. 1, a magnet 2 having a cylindrical shape is shown as an example of means for generating the rotating magnetic field MF. The magnet 2 has an N pole and an S pole that are arranged symmetrically with respect to a virtual plane including the central axis of the cylindrical shape. The magnet 2 rotates about the central axis of the cylindrical shape. Consequently, the direction of the rotating magnetic field MF generated by the magnet 2 rotates about a center of rotation C including the central axis of the cylindrical shape.

The reference position is located within a virtual plane parallel to an end face of the magnet 2. This virtual plane will hereinafter be referred to as the reference plane. In the reference plane, the direction of the rotating magnetic field MF generated by the magnet 2 rotates about the reference position. The reference direction is located within the reference plane and intersects the reference position. In the following description, the direction of the rotating magnetic field MF in the reference position refers to a direction located within the reference plane. The rotating field sensor 1 is disposed to face the aforementioned end face of the magnet 2. As will be described later in relation to other embodiments, the means for generating the rotating magnetic field MF is not limited to the magnet 2 shown in FIG. 1.

Definitions of directions and angles used in the first embodiment will now be described with reference to FIG. 1 and FIG. 2. First, the direction parallel to the center of rotation C shown in FIG. 1 and from bottom to top in FIG. 1 is defined as the Z direction. In FIG. 2, the Z direction is shown as the direction out of the plane of FIG. 2. Next, two directions that are perpendicular to the Z direction and orthogonal to each other are defined as the X direction and the Y direction. In FIG. 2, the X direction is shown as the rightward direction, and the Y direction is shown as the upward direction. Further, the direction opposite to the X direction is defined as the −X direction, and the direction opposite to the Y direction is defined as the −Y direction.

The reference position PR is the position where the rotating field sensor 1 detects the rotating magnetic field MF. The reference direction DR shall be the −X direction. The angle that the direction DM of the rotating magnetic field MF in the reference position PR forms with respect to the reference direction DR will be denoted by symbol θ. The direction DM of the rotating magnetic field MF shall rotate counterclockwise in FIG. 2. The angle θ will be expressed in a positive value when seen counterclockwise from the reference direction DR, and in a negative value when seen clockwise from the reference direction DR. The rotating field sensor 1 outputs an angle detection value θs having a correspondence relationship with the angle θ.

The rotating field sensor 1 according to the first embodiment may be configured in either a first mode or a second mode. In the first mode, the rotating field sensor 1 includes n detection circuits and an angle calculation unit. Each of the n detection circuits includes at least one magnetic detection element and generates an output signal responsive to the direction DM of the rotating magnetic field MF. The angle calculation unit calculates g angle values in correspondence to g groups each consisting of m detection circuits selected from the n detection circuits. Each of the g angle values has a correspondence relationship with the angle θ. Here, n, m and g satisfy the following requirements 1, 2 and 3, respectively. Requirement 1 is that m be an integer not less than two. Requirement 2 is that n be an integer greater than m by two or more. Requirement 3 is that g be an integer not less than three and not more than $_nC_m$.

The angle calculation unit calculates each of the g angle values on the basis of m output signals of the m detection circuits constituting a corresponding one of the g groups. It is required that each of the n detection circuits be used to constitute at least one and not more than (g−2) of the g groups. This will be referred to as requirement 4. The meanings of requirements 1 to 4 will be described in detail later.

The rotating field sensor 1 in the first mode further includes an angle determination unit configured to determine the angle detection value θs by using the g angle values mentioned above. In the case of a failure of one of the n detection circuits, the angle determination unit extracts from the g angle values a plurality of correct angle values corresponding to a plurality of ones of the g groups that do not include the failed detection circuit, and determines the angle detection value θs on the basis of at least one of the plurality of correct angle values. In the first embodiment, failures of a detection circuit include such ones that the output signal of the detection circuit deviates from a predetermined normal value by a relatively small amount. Such failures can occur, for example, when one of a plurality of MR films to be described later is short-circuited or when the plurality of MR films become anisotropic.

The angle determination unit may include an angle difference calculation unit and a determination unit. The angle difference calculation unit calculates at least g angle differences for respective at least g angle value pairs each consisting of two angle values selected from the g angle values. Each of the at least g angle differences is a difference between the two angle values constituting a corresponding one of the at least g angle value pairs. Each of the g angle values is used to constitute at least two of the at least g angle value pairs. The determination unit extracts one or more angle differences that fall within a predetermined range from the at least g angle differences. The determination unit then determines a plurality of angle values constituting one or more angle value pairs corresponding to the extracted one or more angle differences to be the plurality of correct angle values.

In such a manner, the rotating field sensor 1 in the first mode is able to output a correct angle detection value θs even if one of the n detection circuits fails. In the second mode, the rotating field sensor 1 is further able to identify the failed detection circuit.

The rotating field sensor 1 in the second mode includes a failure detection unit to identify a failed detection circuit, in place of the angle determination unit of the rotating field sensor 1 in the first mode. In the case of a failure of one of the n detection circuits, the failure detection unit extracts from the g angle values all incorrect angle values corresponding to all ones of the g groups that include the failed detection circuit. The failure detection unit then identifies a detection circuit that is included in all ones of the g groups that correspond to all the incorrect angle values and included in none of ones of the g groups that correspond to any angle values other than all the incorrect angle values as the failed detection circuit.

For the rotating field sensor 1 in the second mode, g satisfies not only requirement 3 but also a requirement that g be greater than m by two or more and be not less than (n−m+1). Such a requirement will hereinafter be referred to as requirement 5. The rotating field sensor 1 in the second mode further satisfies a requirement that the g groups be formed of such combinations of detection circuits that in the case of a failure of whichever one of the n detection circuits, there is no detection circuit other than the failed detection circuit that is included in all ones of the g groups that include the failed detection circuit and included in none of the other ones of the g groups. Such a requirement will hereinafter be referred to as requirement 6. The meanings of requirements 5 and 6 will be described in detail later.

In the rotating field sensor 1 in the second mode, the failure detection unit determines the angle detection value θs. The angle detection value θs is determined on the basis of one or more angle values other than all the incorrect angle values.

The failure detection unit may include an angle difference calculation unit and a failure determination unit. The angle difference calculation unit of the rotating field sensor 1 in the second mode has the same function as that of the angle difference calculation unit of the rotating field sensor 1 in the first mode. The failure determination unit extracts all angle differences that fall within a predetermined range from the at least g angle differences, and determines all angle values that are not included in any of all angle value pairs corresponding to all the extracted angle differences to be all the incorrect angle values.

An overview of an angle determination method according to the first embodiment will now be described. The angle determination method according to the first embodiment may be in either a first mode or a second mode. In the first mode, the angle determination method determines the angle detection value θs by using the rotating field sensor 1 in the first mode. In the second mode, the angle determination method determines the angle detection value θs by using the rotating field sensor 1 in the second mode. If one of the n detection circuits fails, the angle determination method in the second mode further identifies the failed detection circuit.

The angle determination methods in the first and second modes each include a first step and a second step. The first step calculates g angle values in correspondence to g groups each consisting of m detection circuits selected from the n detection circuits. Each of the g angle values has a correspondence relationship with the angle θ. Each of the g angle values is calculated on the basis of m output signals of the m detection circuits constituting a corresponding one of the g groups. The second step determines the angle detection value θs by using the g angle values. The angle determination methods in the first and second modes both satisfy the foregoing requirements 1 to 4. The angle determination method in the second mode further satisfies the foregoing requirements 5 and 6.

In the angle determination method in the first mode, if one of the n detection circuits fails, the second step extracts from the g angle values a plurality of correct angle values corresponding to a plurality of ones of the g groups that do not include the failed detection circuit. The second step then determines the angle detection value θs on the basis of at least one of the plurality of correct angle values.

The second step of the angle determination method in the first mode may include: a step of calculating at least g angle differences for respective at least g angle value pairs each consisting of two angle values selected from the g angle values, each of the at least g angle differences being a difference between the two angle values constituting a corresponding one of the at least g angle value pairs; and a step of extracting one or more angle differences that fall within a predetermined range from the at least g angle differences, and determining a plurality of angle values constituting one or more angle value pairs corresponding to the extracted one or more angle differences to be the plurality of correct angle values. Each of the g angle values is used to constitute at least two of the at least g angle value pairs.

In the angle determination method in the second mode, if one of the n detection circuits fails, the second step extracts from the g angle values all incorrect angle values corresponding to all ones of the g groups that include the failed detection circuit. The second step then identifies a detection circuit that is included in all ones of the g groups that correspond to all the incorrect angle values and included in none of ones of the g groups that correspond to any angle values other than all the incorrect angle values as the failed detection circuit. The angle detection value θs is determined on the basis of one or more angle values other than all the incorrect angle values.

The second step of the angle determination method in the second mode may include: a step of calculating at least g angle differences for respective at least g angle value pairs each consisting of two angle values selected from the g angle values, each of the at least g angle differences being a difference between the two angle values constituting a corresponding one of the at least g angle value pairs; and a step of identifying the failed detection circuit on the basis of the at least g angle differences. Each of the g angle values is used to constitute at least two of the at least g angle value pairs. The step of identifying the failed detection circuit extracts all angle differences that fall within a predetermined range from the at least g angle differences, and determines all angle values that are not included in any of all angle value pairs corresponding to all the extracted angle differences to be all the incorrect angle values.

To facilitate understanding of the rotating field sensor 1 and the angle determination method according to the first embodiment, first and second practical examples of the rotating field sensor 1 and first and second practical examples of the angle determination method will be described below. The rotating field sensor 1 and the angle determination method according to the first embodiment will subsequently be described in a conceptual manner.

The rotating field sensor 1 of the first practical example corresponds to the rotating field sensor 1 in the first mode described above and satisfies the foregoing requirements 1 to 4. The rotating field sensor 1 of the second practical example corresponds to the rotating field sensor 1 in the second mode described above and satisfies the foregoing requirements 1 to 6. In the rotating field sensors 1 of the first and second practical examples, n is four, m is two, g is four, and each of the four detection circuits is used to constitute two of the four groups.

Figure 3:
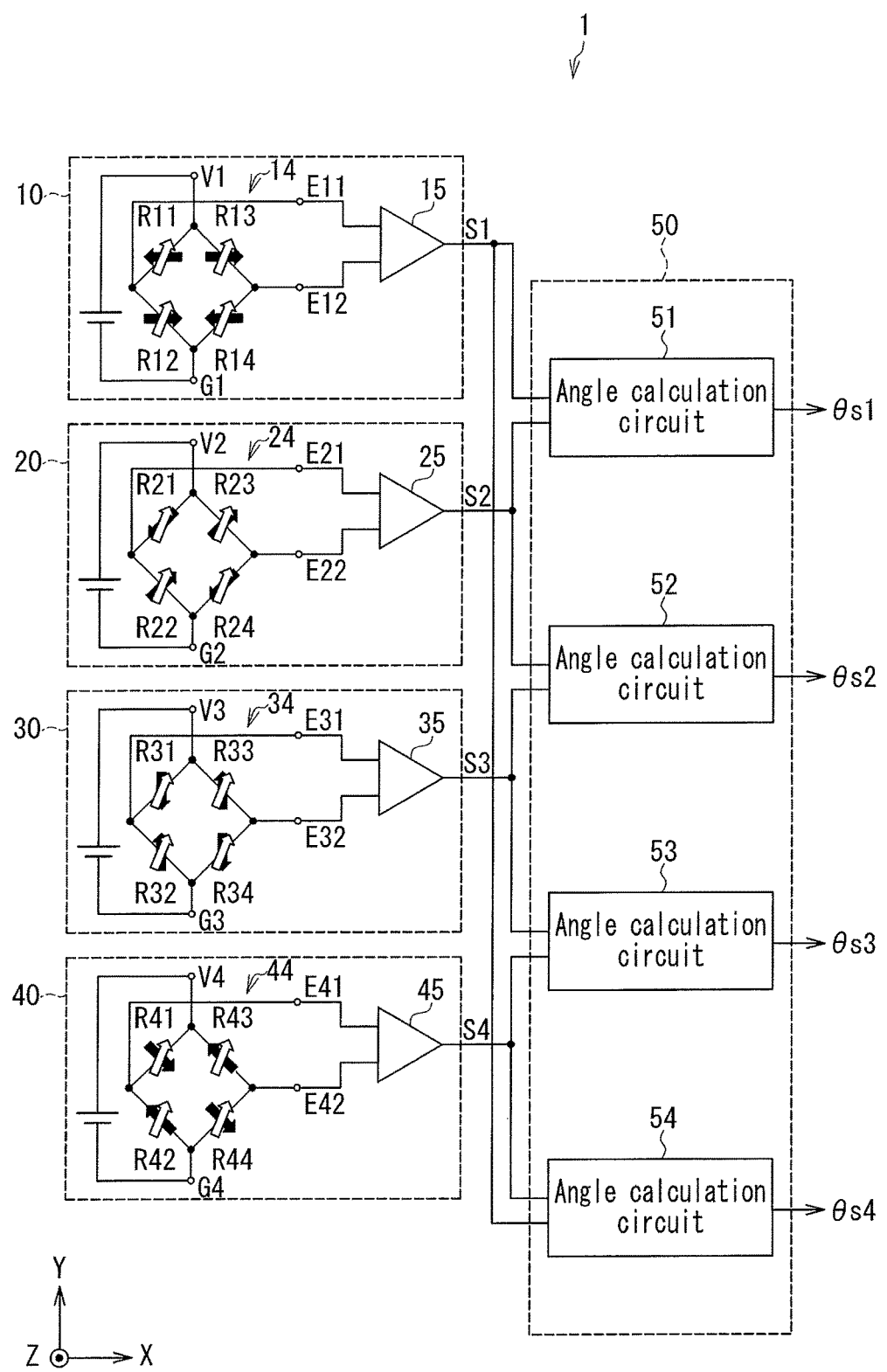
FIG. 3 is a circuit diagram illustrating a portion of the rotating field sensor according to the first embodiment of the invention.

FIG. 3 is a circuit diagram illustrating a portion of the rotating field sensor 1 of each of the first and second practical examples. As shown in FIG. 3, the rotating field sensor 1 of each of the first and second practical examples includes four detection circuits, that is, a first detection circuit 10, a second detection circuit 20, a third detection circuit 30, and a fourth detection circuit 40. To facilitate understanding, the first to fourth detection circuits 10, 20, 30 and 40 are depicted as separate components in FIG. 1. However, the first to fourth detection circuits 10, 20, 30 and 40 may be integrated into a single component. Further, while in FIG. 1 the first to fourth detection circuits 10, 20, 30 and 40 are stacked in a direction parallel to the center of rotation C, the order of stacking is not limited to the example shown in FIG. 1.

The position where the first detection circuit 10 is located will be referred to as the first position P1, the position where the second detection circuit 20 is located will be referred to as the second position P2, the position where the third detection circuit 30 is located will be referred to as the third position P3, and the position where the fourth detection circuit 40 is located will be referred to as the fourth position P4. In the first and second practical examples, the first to fourth positions P1 to P4 are the same in the direction of rotation of the rotating magnetic field MF, and coincide with the reference position PR.

Each of the first to fourth detection circuits 10, 20, 30 and 40 includes at least one magnetic detection element. The first to fourth detection circuits 10, 20, 30 and 40 generate first to fourth output signals, respectively, each of the first to fourth output signals being responsive to the direction DM of the rotating magnetic field MF. More specifically, the first detection circuit 10 generates a first output signal S1 corresponding to the relative angle between the direction DM of the rotating magnetic field MF and a first direction D1. The first output signal S1 is maximum when the direction DM of the rotating magnetic field MF is the same as the first direction D1. The second detection circuit 20 generates a second output signal S2 corresponding to the relative angle between the direction DM of the rotating magnetic field MF and a second direction D2. The second output signal S2 is maximum when the direction DM of the rotating magnetic field MF is the same as the second direction D2. The third detection circuit 30 generates a third output signal S3 corresponding to the relative angle between the direction DM of the rotating magnetic field MF and a third direction D3. The third output signal S3 is maximum when the direction DM of the rotating magnetic field MF is the same as the third direction D3. The fourth detection circuit 40 generates a fourth output signal S4 corresponding to the relative angle between the direction DM of the rotating magnetic field MF and a fourth direction D4. The fourth output signal S4 is maximum when the direction DM of the rotating magnetic field MF is the same as the fourth direction D4.

In the first and second practical examples, as shown in FIG. 2, the first direction D1 is the same as the reference direction DR (the −X direction). The second direction D2 is the direction rotated counterclockwise by θ2 from the first direction D1 (the reference direction DR). The third direction D3 is the direction rotated counterclockwise by θ3 from the first direction D1. The fourth direction D4 is the direction rotated counterclockwise by θ4 from the first direction D1. In the first and second practical examples, θ2, θ3 and θ4 are specifically 45°, 90° and 135°, respectively. The third direction D3 is the same as the −Y direction.

The first to fourth output signals S1 to S4 vary periodically with a predetermined signal period T, and are different in phase from each other. Ideally, the waveform of each of the first to fourth output signals S1 to S4 should trace a sinusoidal curve (including a sine waveform and a cosine waveform). The phase difference between the first output signal S1 and the second output signal S2 has an absolute value of 45°. The phase difference between the first output signal S1 and the third output signal S3 has an absolute value of 90°. The phase difference between the first output signal S1 and the fourth output signal S4 has an absolute value of 135°. The phase difference between the second output signal S2 and the third output signal S3 and the phase difference between the third output signal S3 and the fourth output signal S4 both have an absolute value of 45°. In consideration of the production accuracy of the magnetic detection elements and other factors, the absolute values of the aforementioned phase differences may be slightly different from those mentioned above.

As shown in FIG. 3, the first detection circuit 10 includes a Wheatstone bridge circuit 14, a difference detector 15, a power supply port V1, and a ground port G1. The Wheatstone bridge circuit 14 includes a first pair of serially connected magnetic detection elements R11 and R12, a second pair of serially connected magnetic detection elements R13 and R14, and two output ports E11 and E12. Each of the magnetic detection elements R11 and R13 has a first end connected to the power supply port V1. The magnetic detection element R11 has a second end connected to a first end of the magnetic detection element R12 and the output port E11. The magnetic detection element R13 has a second end connected to a first end of the magnetic detection element R14 and the output port E12. Each of the magnetic detection elements R12 and R14 has a second end connected to the ground port G1. A predetermined voltage is applied between the power supply port V1 and the ground port G1. The difference detector 15 has two inputs connected to the output ports E11 and E12, and an output. The difference detector 15 outputs a signal corresponding to the potential difference between the output ports E11 and E12 as the first output signal S1.

The second to fourth detection circuits 20, 30 and 40 are configured in the same manner as the first detection circuit 10. More specifically, the second detection circuit 20 includes a Wheatstone bridge circuit 24, a difference detector 25, a power supply port V2, and a ground port G2. The Wheatstone bridge circuit 24 includes a first pair of serially connected magnetic detection elements R21 and R22, a second pair of serially connected magnetic detection elements R23 and R24, and two output ports E21 and E22. Each of the magnetic detection elements R21 and R23 has a first end connected to the power supply port V2. The magnetic detection element R21 has a second end connected to a first end of the magnetic detection element R22 and the output port E21. The magnetic detection element R23 has a second end connected to a first end of the magnetic detection element R24 and the output port E22. Each of the magnetic detection elements R22 and R24 has a second end connected to the ground port G2. A predetermined voltage is applied between the power supply port V2 and the ground port G2. The difference detector 25 has two inputs connected to the output ports E21 and E22, and an output. The difference detector 25 outputs a signal corresponding to the potential difference between the output ports E21 and E22 as the second output signal S2.

The third detection circuit 30 includes a Wheatstone bridge circuit 34, a difference detector 35, a power supply port V3, and a ground port G3. The Wheatstone bridge circuit 34 includes a first pair of serially connected magnetic detection elements R31 and R32, a second pair of serially connected magnetic detection elements R33 and R34, and two output ports E31 and E32. Each of the magnetic detection elements R31 and R33 has a first end connected to the power supply port V3. The magnetic detection element R31 has a second end connected to a first end of the magnetic detection element R32 and the output port E31. The magnetic detection element R33 has a second end connected to a first end of the magnetic detection element R34 and the output port E32. Each of the magnetic detection elements R32 and R34 has a second end connected to the ground port G3. A predetermined voltage is applied between the power supply port V3 and the ground port G3. The difference detector 35 has two inputs connected to the output ports E31 and E32, and an output. The difference detector 35 outputs a signal corresponding to the potential difference between the output ports E31 and E32 as the third output signal S3.

The fourth detection circuit 40 includes a Wheatstone bridge circuit 44, a difference detector 45, a power supply port V4, and a ground port G4. The Wheatstone bridge circuit 44 includes a first pair of serially connected magnetic detection elements R41 and R42, a second pair of serially connected magnetic detection elements R43 and R44, and two output ports. E41 and E42. Each of the magnetic detection elements R41 and R43 has a first end connected to the power supply port V4. The magnetic detection element R41 has a second end connected to a first end of the magnetic detection element R42 and the output port E41. The magnetic detection element R43 has a second end connected to a first end of the magnetic detection element R44 and the output port E42. Each of the magnetic detection elements R42 and R44 has a second end connected to the ground port G4. A predetermined voltage is applied between the power supply port V4 and the ground port G4. The difference detector 45 has two inputs connected to the output ports E41 and E42, and an output. The difference detector 45 outputs a signal corresponding to the potential difference between the output ports E41 and E42 as the fourth output signal S4.

In the first and second practical examples, all the magnetic detection elements included in the Wheatstone bridge circuits (hereinafter referred to as bridge circuits) 14, 24, 34 and 44 are magnetoresistive (MR) elements, and more specifically, spin-valve MR elements. The spin-valve MR elements may be TMR elements or GMR elements. GMR and TMR elements each include a magnetization pinned layer whose magnetization direction is pinned, a free layer which is a magnetic layer whose magnetization direction varies depending on the direction DM of the rotating magnetic field MF, and a nonmagnetic layer disposed between the magnetization pinned layer and the free layer. For TMR elements, the nonmagnetic layer is a tunnel barrier layer. For GMR elements, the nonmagnetic layer is a nonmagnetic conductive layer. Each of TMR and GMR elements varies in resistance depending on the angle that the magnetization direction of the free layer forms with respect to the magnetization direction of the magnetization pinned layer, and has a minimum resistance when the foregoing angle is 0°, and a maximum resistance when the foregoing angle is 180°. In the following description, the magnetic detection elements included in the bridge circuits 14, 24, 34 and 44 will be referred to as MR elements. In FIG. 3, the filled arrows indicate the magnetization directions of the magnetization pinned layers of the MR elements, and the hollow arrows indicate the magnetization directions of the free layers of the MR elements.

In the first detection circuit 10, the magnetization pinned layers of the MR elements R11 and R14 are magnetized in the first direction D1 (the −X direction) shown in FIG. 2, and the magnetization pinned layers of the MR elements R12 and R13 are magnetized in the opposite direction to the magnetization direction of the magnetization pinned layers of the MR elements R11 and R14. In this case, the potential difference between the output ports E11 and E12 varies depending on the relative angle between the direction DM of the rotating magnetic field MF and the first direction D1. In this manner, the first output signal S1 responsive to the direction DM of the rotating magnetic field MF is generated by the first detection circuit 10.

In the second detection circuit 20, the magnetization pinned layers of the MR elements R21 and R24 are magnetized in the second direction D2 shown in FIG. 2, and the magnetization pinned layers of the MR elements R22 and R23 are magnetized in the opposite direction to the magnetization direction of the magnetization pinned layers of the MR elements R21 and R24. In this case, the potential difference between the output ports. E21 and E22 varies depending on the relative angle between the direction DM of the rotating magnetic field MF and the second direction D2. In this manner, the second output signal S2 responsive to the direction DM of the rotating magnetic field MF is generated by the second detection circuit 20.

In the third detection circuit 30, the magnetization pinned layers of the MR elements R31 and R34 are magnetized in the third direction D3 (the −Y direction) shown in FIG. 2, and the magnetization pinned layers of the MR elements R32 and R33 are magnetized in the opposite direction to the magnetization direction of the magnetization pinned layers of the MR elements R31 and R34. In this case, the potential difference between the output ports E31 and E32 varies depending on the relative angle between the direction DM of the rotating magnetic field MF and the third direction D3. In this manner, the third output signal S3 responsive to the direction DM of the rotating magnetic field MF is generated by the third detection circuit 30.

In the fourth detection circuit 40, the magnetization pinned layers of the MR elements R41 and R44 are magnetized in the fourth direction D4 shown in FIG. 2, and the magnetization pinned layers of the MR elements R42 and R43 are magnetized in the opposite direction to the magnetization direction of the magnetization pinned layers of the MR elements R41 and R44. In this case, the potential difference between the output ports E41 and E42 varies depending on the relative angle between the direction DM of the rotating magnetic field MF and the fourth direction D4. In this manner, the fourth output signal S4 responsive to the direction DM of the rotating magnetic field MF is generated by the fourth detection circuit 40.

In consideration of the production accuracy of the MR elements and other factors, the magnetization directions of the magnetization pinned layers of the plurality of MR elements in the detection circuits 10, 20, 30 and 40 may be slightly different from those described above.

The bridge circuits 14, 24, 34 and 44 may have the same mechanical structure and be placed in the same orientation, with only the magnetization directions of the plurality of magnetization pinned layers included therein varied among the bridge circuits 14, 24, 34 and 44, as shown in FIG. 3. Alternatively, in addition to having the same mechanical structure, the bridge circuits 14, 24, 34 and 44 may be configured so that the magnetizations of the plurality of magnetization pinned layers included therein are in the same relative direction with respect to the mechanical structure. In this case, placing the bridge circuits 14, 24, 34 and 44 in orientations different from each other allows the magnetization directions of the plurality of magnetization pinned layers included therein to be varied among the bridge circuits 14, 24, 34 and 44 as shown in FIG. 3.

Figure 6:
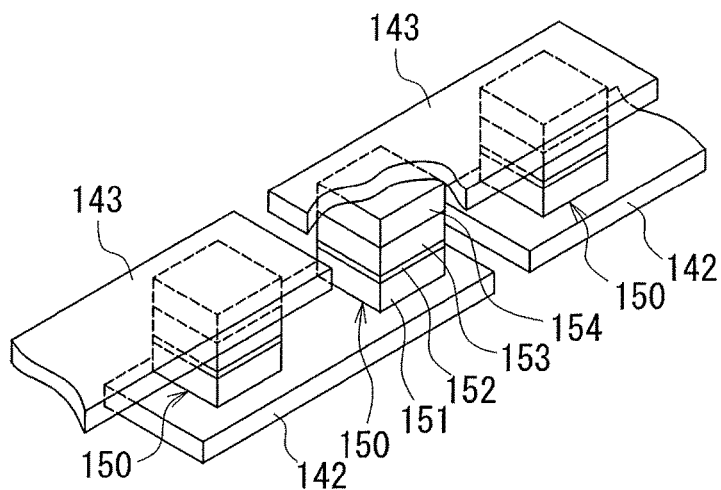
FIG. 6 is a perspective view of a portion of an MR element shown in FIG. 3.

An example of the configuration of the MR elements will now be described with reference to FIG. 6. FIG. 6 is a perspective view illustrating a portion of an MR element in the rotating field sensor 1 shown in FIG. 3. In this example, the MR element includes a plurality of lower electrodes 142, a plurality of MR films 150 and a plurality of upper electrodes 143. The plurality of lower electrodes 142 are arranged on a substrate (not illustrated). Each of the lower electrodes 142 has a long slender shape. Every two lower electrodes 142 that adjoin in the longitudinal direction of the lower electrodes 142 have a gap therebetween. As shown in FIG. 6, MR films 150 are provided on the top surfaces of the lower electrodes 142, near opposite ends in the longitudinal direction. Each of the MR films 150 includes a free layer 151, a nonmagnetic layer 152, a magnetization pinned layer 153, and an antiferromagnetic layer 154 which are stacked in this order, the free layer 151 being closest to the lower electrode 142. The free layer 151 is electrically connected to the lower electrode 142. The antiferromagnetic layer 154 is formed of an antiferromagnetic material. The antiferromagnetic layer 154 is in exchange coupling with the magnetization pinned layer 153 so as to pin the magnetization direction of the magnetization pinned layer 153. The plurality of upper electrodes 143 are arranged over the plurality of MR films 150. Each of the upper electrodes 143 has a long slender shape, and establishes electrical connection between the respective antiferromagnetic layers 154 of two adjoining MR films 150 that are arranged on two lower electrodes 142 adjoining in the longitudinal direction of the lower electrodes 142. With such a configuration, the plurality of MR films 150 in the MR element shown in FIG. 6 are connected in series by the plurality of lower electrodes 142 and the plurality of upper electrodes 143. It should be appreciated that the layers 151 to 154 of the MR films 150 may be stacked in an order reverse to that shown in FIG. 6.

Figure 5:
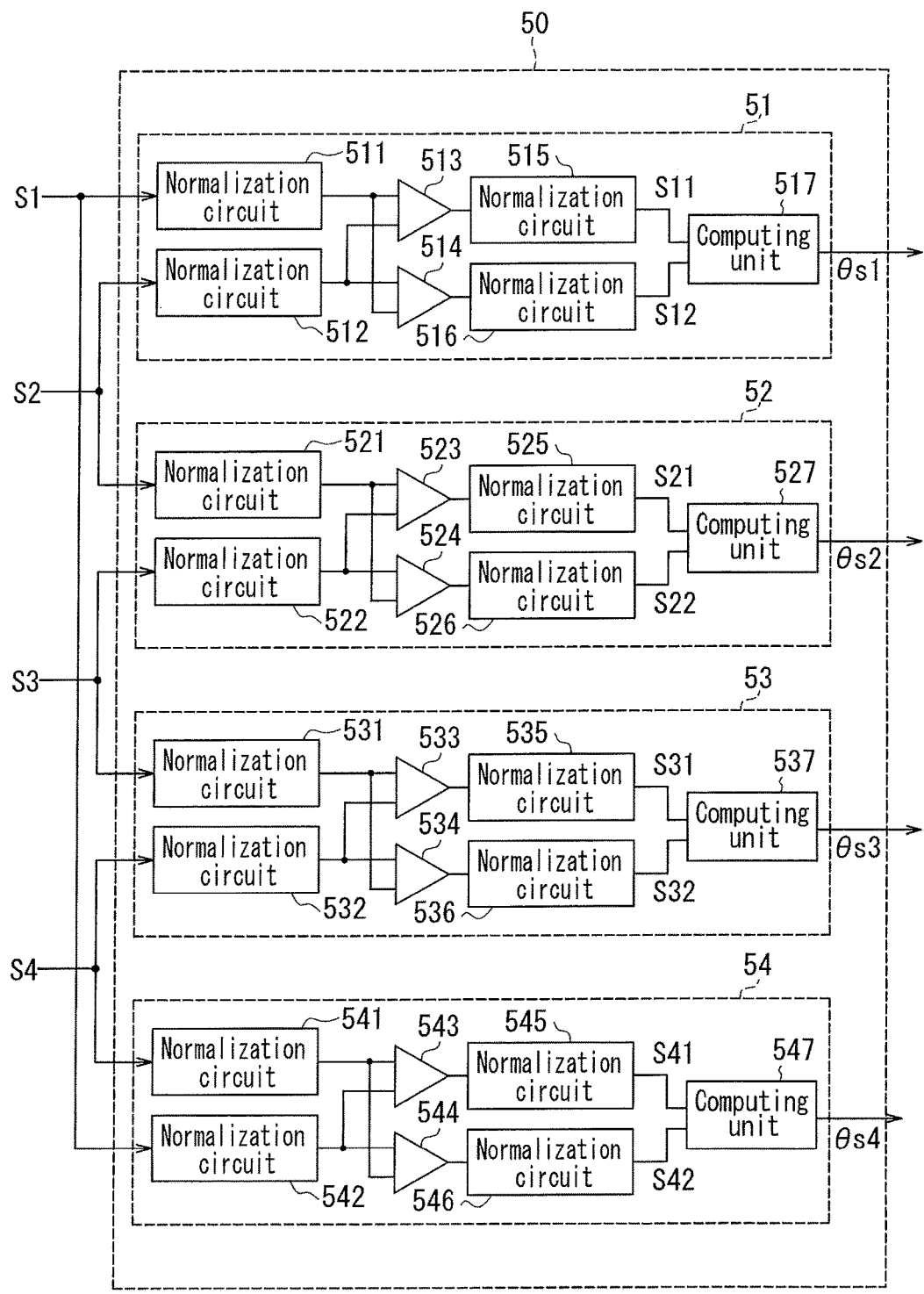
FIG. 5 is a block diagram illustrating the configuration of the angle calculation unit shown in FIG. 3.

As shown in FIG. 3, the rotating field sensor 1 of each of the first and second practical examples further includes an angle calculation unit 50. FIG. 5 is a block diagram illustrating the configuration of the angle calculation unit 50. In the first and second practical examples, the angle calculation unit 50 calculates four angle values. The angle calculation unit 50 includes a first angle calculation circuit 51, a second angle calculation circuit 52, a third angle calculation circuit 53 and a fourth angle calculation circuit 54. Each of the first to fourth angle calculation circuits 51 to 54 has two inputs and an output. The two inputs of the first angle calculation circuit 51 are connected to the output of the difference detector 15 of the first detection circuit 10 and the output of the difference detector 25 of the second detection circuit 20. The two inputs of the second angle calculation circuit 52 are connected to the output of the difference detector 25 of the second detection circuit 20 and the output of the difference detector 35 of the third detection circuit 30. The two inputs of the third angle calculation circuit 53 are connected to the output of the difference detector 35 of the third detection circuit 30 and the output of the difference detector 45 of the fourth detection circuit 40. The two inputs of the fourth angle calculation circuit 54 are connected to the output of the difference detector 45 of the fourth detection circuit 40 and the output of the difference detector 15 of the first detection circuit 10.

The first angle detection circuit 51 includes normalization circuits 511, 512, 515 and 516, an adder circuit 513, a subtractor circuit 514, and a computing unit 517. Each of the normalization circuits 511, 512, 515 and 516 has an input and an output. Each of the adder circuit 513, the subtractor circuit 514 and the computing unit 517 has two inputs and an output. The two inputs of the first angle calculation circuit 51 are formed by the respective inputs of the normalization circuits 511 and 512. Thus, the respective inputs of the normalization circuits 511 and 512 are connected to the respective outputs of the difference detectors 15 and 25. The two inputs of the adder circuit 513 are connected to the respective outputs of the normalization circuits 511 and 512. The two inputs of the subtractor circuit 514 are also connected to the respective outputs of the normalization circuits 511 and 512. The input of the normalization circuit 515 is connected to the output of the adder circuit 513. The input of the normalization circuit 516 is connected to the output of the subtractor circuit 514. The two inputs of the computing unit 517 are connected to the respective outputs of the normalization circuits 515 and 516. The output of the first angle calculation circuit 51 is formed by the output of the computing unit 517.

The second to fourth angle calculation circuits 52 to 54 are configured in the same manner as the first angle calculation circuit 51. More specifically, the second angle calculation circuit 52 includes normalization circuits 521, 522, 525 and 526, an adder circuit 523, a subtractor circuit 524, and a computing unit 527. Each of the normalization circuits 521, 522, 525 and 526 has an input and an output. Each of the adder circuit 523, the subtractor circuit 524 and the computing unit 527 has two inputs and an output. The two inputs of the second angle calculation circuit 52 are formed by the respective inputs of the normalization circuits 521 and 522. Thus, the respective inputs of the normalization circuits 521 and 522 are connected to the respective outputs of the difference detectors 25 and 35. The two inputs of the adder circuit 523 are connected to the respective outputs of the normalization circuits 521 and 522. The two inputs of the subtractor circuit 524 are also connected to the respective outputs of the normalization circuits 521 and 522. The input of the normalization circuit 525 is connected to the output of the adder circuit 523. The input of the normalization circuit 526 is connected to the output of the subtractor circuit 524. The two inputs of the computing unit 527 are connected to the respective outputs of the normalization circuits 525 and 526. The output of the second angle calculation circuit 52 is formed by the output of the computing unit 527.

The third angle calculation circuit 53 includes normalization circuits 531, 532, 535 and 536, an adder circuit 533, a subtractor circuit 534, and a computing unit 537. Each of the normalization circuits 531, 532, 535 and 536 has an input and an output. Each of the adder circuit 533, the subtractor circuit 534 and the computing unit 537 has two inputs and an output. The two inputs of the third angle calculation circuit 53 are formed by the respective inputs of the normalization circuits 531 and 532. Thus, the respective inputs of the normalization circuits 531 and 532 are connected to the respective outputs of the difference detectors 35 and 45. The two inputs of the adder circuit 533 are connected to the respective outputs of the normalization circuits 531 and 532. The two inputs of the subtractor circuit 534 are also connected to the respective outputs of the normalization circuits 531 and 532. The input of the normalization circuit 535 is connected to the output of the adder circuit 533. The input of the normalization circuit 536 is connected to the output of the subtractor circuit 534. The two inputs of the computing unit 537 are connected to the respective outputs of the normalization circuits 535 and 536. The output of the third angle calculation circuit 53 is formed by the output of the computing unit 537.

The fourth angle calculation circuit 54 includes normalization circuits 541, 542, 545 and 546, an adder circuit 543, a subtractor circuit 544, and a computing unit 547. Each of the normalization circuits 541, 542, 545 and 546 has an input and an output. Each of the adder circuit 543, the subtractor circuit 544 and the computing unit 547 has two inputs and an output. The two inputs of the fourth angle calculation circuit 54 are formed by the respective inputs of the normalization circuits 541 and 542. Thus, the respective inputs of the normalization circuits 541 and 542 are connected to the respective outputs of the difference detectors 45 and 15. The two inputs of the adder circuit 543 are connected to the respective outputs of the normalization circuits 541 and 542. The two inputs of the subtractor circuit 544 are also connected to the respective outputs of the normalization circuits 541 and 542. The input of the normalization circuit 545 is connected to the output of the adder circuit 543. The input of the normalization circuit 546 is connected to the output of the subtractor circuit 544. The two inputs of the computing unit 547 are connected to the respective outputs of the normalization circuits 545 and 546. The output of the fourth angle calculation circuit 54 is formed by the output of the computing unit 547.

The first to fourth angle calculation circuits 51, 52, 53 and 54 calculate angle values $\theta s1$, $\theta s2$, $\theta s3$ and $\theta s4$, respectively. Each of the angle values $\theta s1$, $\theta s2$, $\theta s3$ and $\theta s4$ has a correspondence relationship with the angle $\theta$. How to calculate the angles values $\theta s1$ to $\theta s4$ will be described later.

Figure 4:
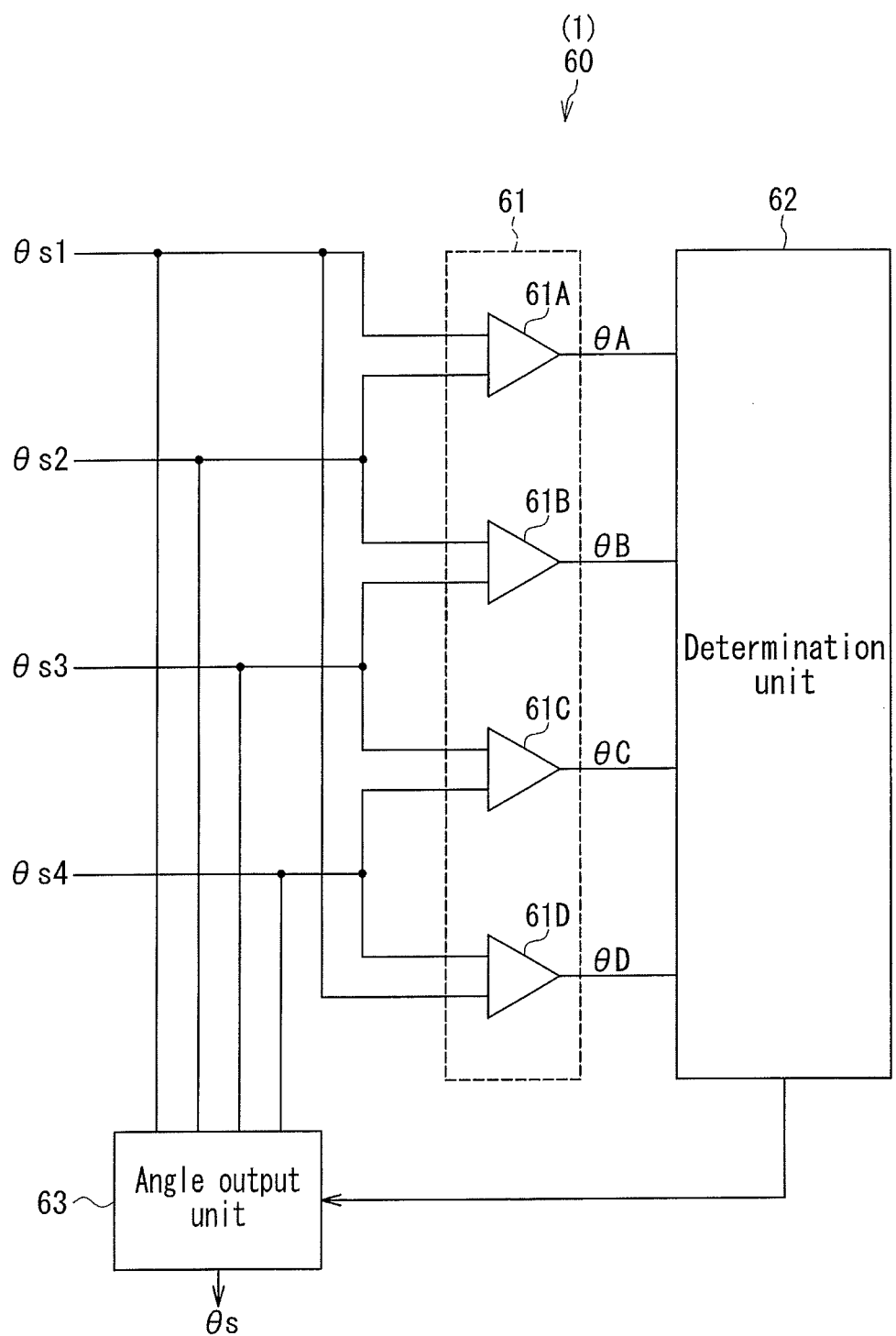
FIG. 4 is a circuit diagram illustrating the remaining portion of the rotating field sensor according to the first embodiment of the invention.

FIG. 4 is a circuit diagram illustrating the rotating field sensor 1 excluding the detection circuits 10, 20, 30 and 40 and the angle calculation unit 50. As shown in FIG. 4, the rotating field sensor 1 of each of the first and second practical examples further includes a control unit 60. The control unit 60 corresponds to both of the angle determination unit of the rotating field sensor 1 in the first mode and the failure detection unit of the rotating field sensor 1 in the second mode. The control unit 60 includes an angle difference calculation unit 61, a determination unit 62, and an angle output unit 63. The determination unit 62 corresponds to both of the determination unit of the rotating field sensor 1 in the first mode and the failure determination unit of the rotating field sensor 1 in the second mode.

In the first and second practical examples, the angle difference calculation unit 61 calculates four angle differences for respective four angle value pairs. The angle difference calculation unit 61 includes a first subtractor circuit 61A, a second subtractor circuit 61B, a third subtractor circuit 61C and a fourth subtractor circuit 61D. Each of the first to fourth subtractor circuits 61A to 61D has two inputs and an output. The determination unit 62 has four inputs. The angle output unit 63 has four inputs and an output.

The two inputs of the first subtractor circuit 61A are connected to the output of the first angle calculation circuit 51 (the output of the computing unit 517) and the output of the second angle calculation circuit 52 (the output of the computing unit 527). The two inputs of the second subtractor circuit 61B are connected to the output of the second angle calculation circuit 52 (the output of the computing unit 527) and the output of the third angle calculation circuit 53 (the output of the computing unit 537). The two inputs of the third subtractor circuit 61C are connected to the output of the third angle calculation circuit 53 (the output of the computing unit 537) and the output of the fourth angle calculation circuit 54 (the output of the computing unit 547). The two inputs of the fourth subtractor circuit 61D are connected to the output of the fourth angle calculation circuit 54 (the output of the computing unit 547) and the output of the first angle calculation circuit 51 (the output of the computing unit 517).

The four inputs of the determination unit 62 are connected to the respective outputs of the first to fourth subtractor circuits 61A to 61D. The four inputs of the angle output unit 63 are connected to the respective outputs of the first to fourth angle calculation circuits 51 to 54 (the respective outputs of the computing units 517, 527, 537 and 547).

The first subtractor circuit 61A calculates an angle difference $\theta A$ which is a difference ($\theta s1-\theta s2$) between two angle values $\theta s1$ and $\theta s2$ constituting an angle value pair ($\theta s1$, $\theta s2$). The second subtractor circuit 61B calculates an angle difference $\theta B$ which is a difference ($\theta s2-\theta s3$) between two angle values $\theta s2$ and $\theta s3$ constituting an angle value pair ($\theta s2$, $\theta s3$). The third subtractor circuit 61C calculates an angle difference $\theta C$ which is a difference ($\theta s3-\theta s4$) between two angle values $\theta s3$ and $\theta s4$ constituting an angle value pair ($\theta s3$, $\theta s4$). The fourth subtractor circuit 61D calculates an angle difference $\theta D$ which is a difference ($\theta s4-\theta s1$) between two angle values $\theta s4$ and $\theta s1$ constituting an angle value pair ($\theta s4$, $\theta s1$).

The determination unit 62 operates differently in the first and second practical examples as follows. In the first practical example, the determination unit 62 extracts a plurality of correct angle values by using the four angle differences $\theta A$ to $\theta D$. In the second practical example, the determination unit 62 identifies a failed detection circuit on the basis of the four angle differences $\theta A$ to $\theta D$. The operations of the determination unit 62 will be described in detail later.

The angle output unit 63 is controlled by the determination unit 62 to determine the angle detection value $\theta s$ and output it from the output. The determination unit 62 and the angle output unit 63 can be implemented by a single microcomputer, for example. In such a case, the determination unit 62 and the angle output unit 63 are implemented by software, not by physically separate elements. How the angle output unit 63 determines the angle detection value $\theta s$ will be described later.

Figure 7:
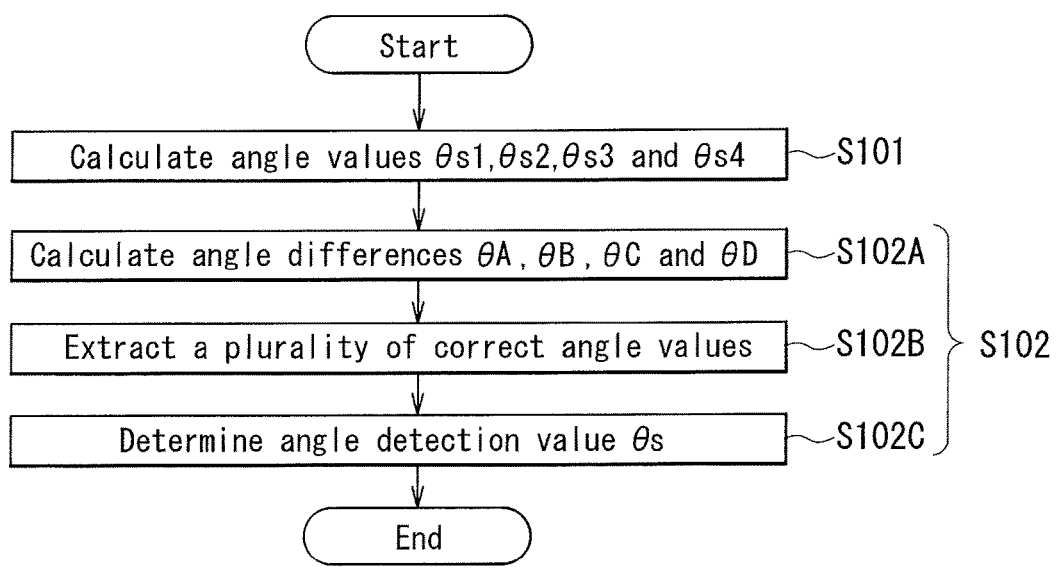
FIG. 7 is a flowchart illustrating a first practical example of the angle determination method according to the first embodiment of the invention.
Figure 8:
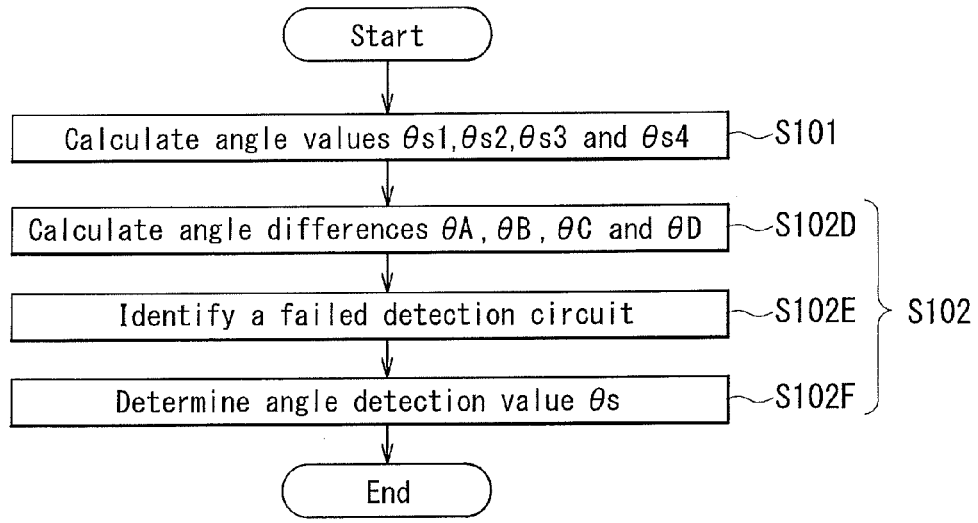
FIG. 8 is a flowchart illustrating a second practical example of the angle determination method according to the first embodiment of the invention.

The operations of the angle calculation unit 50 and the control unit 60, and the angle determination methods of the first and second practical examples will now be described. The angle determination method of the first practical example uses the rotating field sensor 1 of the first practical example. The angle determination method of the first practical example corresponds to the angle determination method in the first mode described previously and satisfies the foregoing requirements 1 to 4. The angle determination method of the second practical examples uses the rotating field sensor 1 of the second practical example. The angle determination method of the second practical example corresponds to the angle determination method in the second mode described previously and satisfies the foregoing requirements 1 to 6. FIG. 7 is a flowchart illustrating the angle determination method of the first practical example. FIG. 8 is a flowchart illustrating the angle determination method of the second practical example. The angle determination methods of the first and second practical examples both include a first step S101 and a second step S102 described below.

In the first step S101, the angle calculation unit 50 calculates four angle values $\theta s1$ to $\theta s4$ in correspondence to four groups each consisting of two detection circuits selected from the four detection circuits 10, 20, 30 and 40. Each of the four angle values $\theta s1$ to $\theta s4$ has a correspondence relationship with the angle detection value $\theta s$. Each of the four detection circuits 10, 20, 30 and 40 is used to constitute at least one and not more than two of the four groups. In the first and second practical examples, each of the four detection circuits 10, 20, 30 and 40 is used to constitute two of the four groups, in particular.

Now, a specific example of a method for calculating the four angle values $\theta s1$ to $\theta s4$ will be described. In this example, each of the four angle values $\theta s1$ to $\theta s4$ is calculated on the basis of two output signals of the two detection circuits constituting a corresponding one of the four groups, as described below. The angle value $\theta s1$ is an angle value calculated for a first group consisting of the first and second detection circuits 10 and 20. The angle value $\theta s1$ is calculated by the first angle calculation circuit 51 on the basis of the first and second output signals S1 and S2. The angle value $\theta s2$ is an angle value calculated for a second group consisting of the second and third detection circuits 20 and 30. The angle value $\theta s2$ is calculated by the second angle calculation circuit 52 on the basis of the second and third output signals S2 and S3. The angle value $\theta s3$ is an angle value calculated for a third group consisting of the third and fourth detection circuits 30 and 40. The angle value $\theta s3$ is calculated by the third angle calculation circuit 53 on the basis of the third and fourth output signals S3 and S4. The angle value $\theta s4$ is an angle value calculated for a fourth group consisting of the fourth and first detection circuits 40 and 10. The angle value $\theta s4$ is calculated by the fourth angle calculation circuit 54 on the basis of the fourth and first output signals S4 and S1.

In the second step S102, the control unit 60 determines the angle detection value $\theta s$ by using the four angle values $\theta s1$ to $\theta s4$. As shown in FIG. 7, the second step S102 of the angle determination method of the first practical example includes steps S102A, S102B, and S102C. Step S102A is to calculate the four angle differences $\theta A$ to $\theta D$ for the respective four angle value pairs each consisting of two angle values selected from the four angle values $\theta s1$ to $\theta s4$, each of the four angle differences $\theta A$ to $\theta D$ being a difference between the two angle values constituting a corresponding one of the four angle value pairs. Step S102B is to extract a plurality of correct angle values by using the four angle differences $\theta A$ to $\theta D$. Step S102C is to determine the angle detection value $\theta s$ on the basis of at least one of the plurality of correct angle values extracted in step S102B. In step S102B, if one of the four detection circuits fails, a plurality of correct angle values corresponding to a plurality of groups that do not include the failed detection circuit are extracted from the four angle values $\theta s1$ to $\theta s4$. Further, in step S102B, one or more angle differences that fall within a predetermined range are extracted from the four angle differences $\theta A$ to $\theta D$, and a plurality of angle values constituting one or more angle value pairs corresponding to the extracted one or more angle differences are determined to be the plurality of correct angle values. Each of the four angle values $\theta s1$ to $\theta s4$ is used to constitute at least two of the four angle value pairs. Step S102A is performed by the angle difference calculation unit 61. Step S102B is performed by the determination unit 62. Step S102C is performed by the angle output unit 63.

As shown in FIG. 8, the second step S102 of the angle determination method of the second practical example includes steps S102D, S102E, and S102F. Step S102D is to calculate the four angle differences θA to θD, being the same as the foregoing step S102A. Step S102E is to identify a failed detection circuit on the basis of the four angle differences θA to θD. Step S102F is to determine the angle detection value θs. Each of the four angle values θs1 to θs4 is used to constitute at least two of the four angle value pairs. In step S102E, all angle differences that fall within a predetermined range are extracted from the four angle differences, and all angle values that are not included in any of all angle value pairs corresponding to all the extracted angle differences are determined to be all incorrect angle values. In such a manner, if one of the four detection circuits fails, all incorrect angle values corresponding to all groups that include the failed detection circuit are extracted from the four angle values θs1 to θs4. Further, in step S102E, a detection circuit that is included in all groups that correspond to all the incorrect angle values and included in none of groups that correspond to any angle values other than all the incorrect angle values is identified as the failed detection circuit. In step S102F, the angle detection value θs is determined on the basis of one or more angle values other than all the incorrect angle values extracted in step S102E. Step S102D is performed by the angle difference calculation unit 61. Step S102E is performed by the determination unit 62. Step S102F is performed by the angle output unit 63.

A specific example of the four angle value pairs and the four angle differences will now be described. In this example, the angle difference θA is an angle difference calculated for an angle value pair consisting of two angle values θs1 and θs2. The angle difference θB is an angle difference calculated for an angle value pair consisting of two angle values θs2 and θs3. The angle difference θC is an angle difference calculated for an angle value pair consisting of two angle values θs3 and θs4. The angle difference θD is an angle difference calculated for an angle value pair consisting of two angle values θs4 and θs1.

How the angle values θs1 to θs4 are calculated at the angle calculation unit 50 in the first step S101 will now be described with reference to FIG. 5. In the following description, suppose that none of the detection circuits 10, 20, 30 and 40 fails. The first angle calculation circuit 51 calculates the angle value θs1 in the following manner. The normalization circuit 511 outputs a signal obtained by normalizing the first output signal S1 to the adder circuit 513 and the subtractor circuit 514. The normalization circuit 512 outputs a signal obtained by normalizing the second output signal S2 to the adder circuit 513 and the subtractor circuit 514. The normalization circuits 511 and 512 normalize the output signals S1 and S2, respectively, in such a manner that the output signals S1 and S2 both have a maximum value of 1 and a minimum value of −1. The absolute value of the phase difference between the first output signal S1 and the second output signal S2 is 45° (π/4). Thus, the normalized signal of the first output signal S1 will be expressed as cos θ, and the normalized signal of the second output signal S2 will be expressed as cos(θ−π/4).

The adder circuit 513 generates an addition signal by a computation that includes determining the sum of the normalized signal cos θ of the first output signal S1 and the normalized signal cos(θ−π/4) of the second output signal S2. The phrase "a computation that includes determining the sum of the normalized signal cos θ of the first output signal S1 and the normalized signal cos(θ−π/4) of the second output signal S2" means that the computation can include not only determining the sum of the normalized signals cos θ and cos(θ−π/4) but also thereafter multiplying the sum by a predetermined coefficient or adding/subtracting a predetermined value to/from the sum for the purpose of normalization or the like. This also applies to other similar phrases.

The subtractor circuit 514 generates a subtraction signal by a computation that includes determining a difference between the normalized signal cos θ of the first output signal S1 and the normalized signal cos(θ−π/4) of the second output signal S2. The normalization circuit 515 outputs a signal S11 obtained by normalizing the addition signal to the computing unit 517. The normalization circuit 516 outputs a signal S12 obtained by normalizing the subtraction signal to the computing unit 517. The normalization circuits 515 and 516 normalize the addition signal and the subtraction signal, respectively, in such a manner that the addition signal and the subtraction signal both have a maximum value of 1 and a minimum value of −1. In this case, the signal S11 is cos(θ−π/8), and the signal S12 is sin(θ−π/8).

The computing unit 517 calculates the angle value θs1 on the basis of the signals S11 and S12. Here, θ−π/8 will be expressed as θp1. The relationship that θs1=θp1+π/8 holds between θs1 and θp1. The computing unit 517 calculates θs1 by Equation (1) below. Note that "atan" represents arctangent.

$$\theta s1 = \theta p1 + \pi/8 \qquad (1)$$
$$= a\tan(S12/S11) + \pi/8$$
$$= a\tan(\sin\theta p1/\cos\theta p1) + \pi/8$$

The term "atan(sin θp1/cos θp1)" of Equation (1) represents the arctangent calculation for determining θp1. For θp1 in the range of 0° to less than 360°, there are two solutions of θp1 in Equation (1) with a difference of 180° in value. Which of the two solutions of θp1 in Equation (1) is the true value of θp1 can be determined from the combination of positive and negative signs on S11 and S12. More specifically, if S11 is positive in value, θp1 is between 0° (inclusive) and 90° (exclusive), and between 270° (exclusive) and 360° (inclusive). If S11 is negative in value, θp1 is greater than 90° and smaller than 270°. If S12 is positive in value, θp1 is greater than 0° and smaller than 180°. If S12 is negative in value, θp1 is greater than 180° and smaller than 360°. Using Equation (1) and on the basis of the foregoing determination from the combination of positive and negative signs on S11 and S12, the computing unit 517 determines θp1 within the range of 0° to less than 360°.

The second to fourth angle calculation circuits 52 to 54 calculate the angle values θs2 to θs4, respectively, basically in the same manner as the first angle calculation circuit 51 calculates the angle value θs1. More specifically, in the second angle calculation circuit 52, the normalization circuit 521 outputs a signal obtained by normalizing the second output signal S2 to the adder circuit 523 and the subtractor circuit 524, like the normalization circuit 511. The normalization circuit 522 outputs a signal obtained by normalizing the third output signal S3 to the adder circuit 523 and the subtractor circuit 524, like the normalization circuit 512. The absolute value of the phase difference between the first output signal S1 and the third output signal S3 is 90° (π/2). Thus, the normalized signal of the third output signal S3 will be expressed as cos(θ−π/2).

The adder circuit 523 generates an addition signal by a computation that includes determining the sum of the normalized signal cos(θ−π/4) of the second output signal S2 and the normalized signal cos(θ−π/2) of the third output signal S3. The subtractor circuit 524 generates a subtraction signal by a computation that includes determining a difference between the normalized signal cos(θ−π/4) of the second output signal S2 and the normalized signal cos(θ−π/2) of the third output signal S3. The normalization circuit 525 outputs a signal S21 obtained by normalizing the addition signal to the computing unit 527, like the normalization circuit 515. The normalization circuit 526 outputs a signal S22 obtained by normalizing the subtraction signal to the computing unit 527, like the normalization circuit 516. In this case, the signal S21 is cos(θ−3π/8), and the signal S22 is sin(θ−3π/8).

The computing unit 527 calculates the angle value θs2 on the basis of the signals S21 and S22. Here, θ−3π/8 will be expressed as θp2. The relationship that θs2=θp2+3π/8 holds between θs2 and θp2. The computing unit 527 calculates θs2 by Equation (2) below.

$$\theta s2 = \theta p2 + 3\pi/8 \quad (2)$$
$$= a\tan(S22/S21) + 3\pi/8$$
$$= a\tan(\sin\theta p2/\cos\theta p2) + 3\pi/8$$

The term "atan(sin θp2/cos θp2)" of Equation (2) represents the arctangent calculation for determining θp2. Like the computing unit 517, the computing unit 527 determines θp2 within the range of 0° to less than 360° using Equation (2) and on the basis of the foregoing determination from the combination of positive and negative signs on S21 and S22.

In the third angle calculation circuit 53, the normalization circuit 531 outputs a signal obtained by normalizing the third output signal S3 to the adder circuit 533 and the subtractor circuit 534, like the normalization circuit 511. The normalization circuit 532 outputs a signal obtained by normalizing the fourth output signal S4 to the adder circuit 533 and the subtractor circuit 534, like the normalization circuit 512. The absolute value of the phase difference between the first output signal S1 and the fourth output signal S4 is 135° (3π/4). Thus, the normalized signal of the fourth output signal S4 will be expressed as cos(θ−3π/4).

The adder circuit 533 generates an addition signal by a computation that includes determining the sum of the normalized signal cos(θ−π/2) of the third output signal S3 and the normalized signal cos(θ−3π/4) of the fourth output signal S4. The subtractor circuit 534 generates a subtraction signal by a computation that includes determining a difference between the normalized signal cos(θ−π/2) of the third output signal S3 and the normalized signal cos(θ−3π/4) of the fourth output signal S4. The normalization circuit 535 outputs a signal S31 obtained by normalizing the addition signal to the computing unit 537, like the normalization circuit 515. The normalization circuit 536 outputs a signal S32 obtained by normalizing the subtraction signal to the computing unit 537, like the normalization circuit 516. In this case, the signal S31 is cos(θ−5π/8), and the signal S32 is sin(θ−5π/8).

The computing unit 537 calculates the angle value θs3 on the basis of the signals S31 and S32. Here, θ−5π/8 will be expressed as θp3. The relationship that θs3=θp3+5π/8 holds between θs3 and θp3. The computing unit 537 calculates θs3 by Equation (3) below.

$$\theta s3 = \theta p3 + 5\pi/8 \quad (3)$$
$$= a\tan(S32/S31) + 5\pi/8$$
$$= a\tan(\sin\theta p3/\cos\theta p3) + 5\pi/8$$

The term "atan(sin θp3/cos θp3)" of Equation (3) represents the arctangent calculation for determining θp3. Like the computing unit 517, the computing unit 537 determines θp3 within the range of 0° to less than 360° using Equation (3) and on the basis of the foregoing determination from the combination of positive and negative signs on S31 and S32.

In the fourth angle calculation circuit 54, the normalization circuit 541 outputs a signal obtained by normalizing the fourth output signal S4 to the adder circuit 543 and the subtractor circuit 544, like the normalization circuit 511. The normalization circuit 542 outputs a signal obtained by normalizing the first output signal S1 to the adder circuit 543 and the subtractor circuit 544, like the normalization circuit 512.

The adder circuit 543 generates an addition signal by a computation that includes determining the sum of the normalized signal cos(θ−3π/4) of the fourth output signal S4 and the normalized signal cos θ of the first output signal S1. The subtractor circuit 544 generates a subtraction signal by a computation that includes determining a difference between the normalized signal cos(θ−3π/4) of the fourth output signal S4 and the normalized signal cos θ of the first output signal S1. The normalization circuit 545 outputs a signal S41 obtained by normalizing the addition signal to the computing unit 547, like the normalization circuit 515. The normalization circuit 546 outputs a signal S42 obtained by normalizing the subtraction signal to the computing unit 547, like the normalization circuit 516. In this case, the signal S41 is −sin(θ—7π/8), and the signal S42 is −cos(θ−7π/8).

The computing unit 547 calculates the angle value θs4 on the basis of the signals S41 and S42. Here, θ−7π/8 will be expressed as θp4. The relationship that θs4=θp4+7π/8 holds between θs4 and θp4. The computing unit 547 calculates θs4 by Equation (4) below.

$$\theta s4 = \theta p4 + 7\pi/8 \quad (4)$$
$$= a\tan(S41/S42) + 7\pi/8$$
$$= a\tan(\sin\theta p4/\cos\theta p4) + 7\pi/8$$

The term "atan(sin θp4/cos θp4)" of Equation (4) represents the arctangent calculation for determining θp4. If S41 is positive in value, θp4 is greater than 180° and smaller than 360°. If S41 is negative in value, θp4 is greater than 0° and smaller than 180°. If S42 is positive in value, θp4 is greater than 90° and smaller than 270°. If S42 is negative in value, θp4 is between 0° (inclusive) and 90° (exclusive), and between 270° (exclusive) and 360° (inclusive). Using Equation (4) and on the basis of the foregoing determination from the combination of positive and negative signs on S41 and S42, the computing unit 547 determines θp4 within the range of 0° to less than 360°.

The characteristics of the first to fourth output signals S1 to S4 and the first to fourth angle values θs1 to θs4 will now be described. Ideally, as mentioned previously, the waveforms of the output signals S1 to S4 should trace a sinusoidal curve. Assume here that each of the first to fourth output signals S1 to S4 contains an ideal component which varies periodically in such a manner as to trace an ideal sinusoidal curve, and an error component other than the ideal component. The error components of the first to fourth output signals S1 to S4 can occur even if none of the first to fourth detection circuits 10, 20, 30 and 40 fails.

Figure 9:
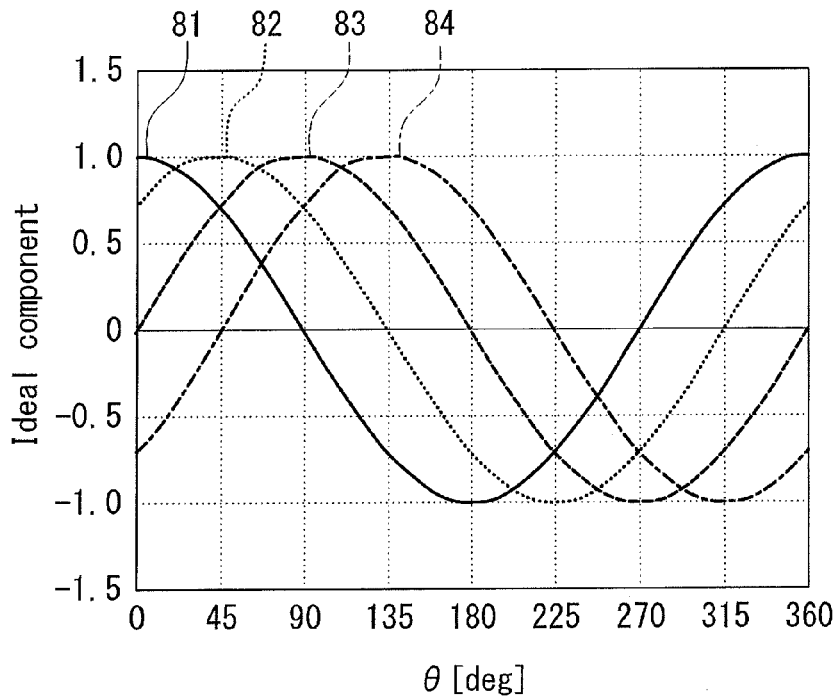
FIG. 9 is a waveform diagram illustrating an example of waveforms of ideal components contained in first to fourth output signals in the first embodiment of the invention.

FIG. 9 is a waveform diagram illustrating an example of waveforms of the ideal components of the first to fourth output signals S1 to S4. In FIG. 9, the horizontal axis represents angle $\theta$, and the vertical axis represents the magnitude of the ideal components. The waveforms labeled 81, 82, 83 and 84 indicate the ideal components of the output signals S1, S2, S3 and S4, respectively. In FIG. 9, the ideal components have been normalized to have a maximum value of 1 and a minimum value of −1.

When the first to fourth output signals S1 to S4 contain their respective error components, the angle values $\theta s1$ to $\theta s4$ calculated on the basis of the first to fourth output signals S1 to S4 contain their respective angle errors. The angle errors of the angle values $\theta s1$ to $\theta s4$ are errors with respect to theoretical values of the angle values $\theta s1$ to $\theta s4$ that are expected when the direction DM of the rotating magnetic field MF rotates ideally.

Now, the principle for determining correct angle values in steps S102A and S102B shown in FIG. 7 and the principle for determining correct angle values and incorrect angle values to identify a failed circuit in steps S102D and S102E shown in FIG. 8 will be described. If the first to fourth detection circuits 10, 20, 30 and 40 are all normal, the angle values $\theta s1$ to $\theta s4$ are identical with or very close to each other, and the angle errors of the angle values $\theta s1$ to $\theta s4$ are also identical with or very close to each other.

If one of the first to fourth detection circuits 10, 20, 30 and 40 fails, the output signal of the failed detection circuit becomes different from that when the detection circuit is normal. As a result, among the four angle values $\theta s1$ to $\theta s4$, two angle values corresponding to two groups that include the failed detection circuit become incorrect angle values, whereas the other two angle values are correct angle values. The two correct angle values are identical with or very close to each other, whereas the two incorrect angle values are distinctly different from the two correct angle values. Similarly, the angle errors of the two correct angle values are identical with or very close to each other, whereas the angle errors of the two incorrect angle values are distinctly different from those of the two correct angle values. Consequently, the two incorrect angle values are distinguishable from the two correct angle values. In this regard, a concrete description will be given below by using an example in which the first detection circuit 10 fails.

If the first detection circuit 10 fails, the two angle values $\theta s1$ and $\theta s4$ calculated for the two groups that include the first detection circuit 10 become incorrect angle values, whereas the two angle values $\theta s2$ and $\theta s3$ calculated for the other two groups not including the first detection circuit 10 are correct angle values. In other words, the angle values $\theta s2$ and $\theta s3$ are identical with or very close to each other, whereas the angle values $\theta s1$ and $\theta s4$ are distinctly different from each other and distinctly different from the angle values $\theta s2$ and $\theta s3$. Similarly, the angle errors of the angle values $\theta s2$ and $\theta s3$ are identical with or very close to each other, whereas the angle errors of the angle values $\theta s1$ and $\theta s4$ are distinctly different from each other and distinctly different from the angle errors of the angle values $\theta s2$ and $\theta s3$.

Figure 10:
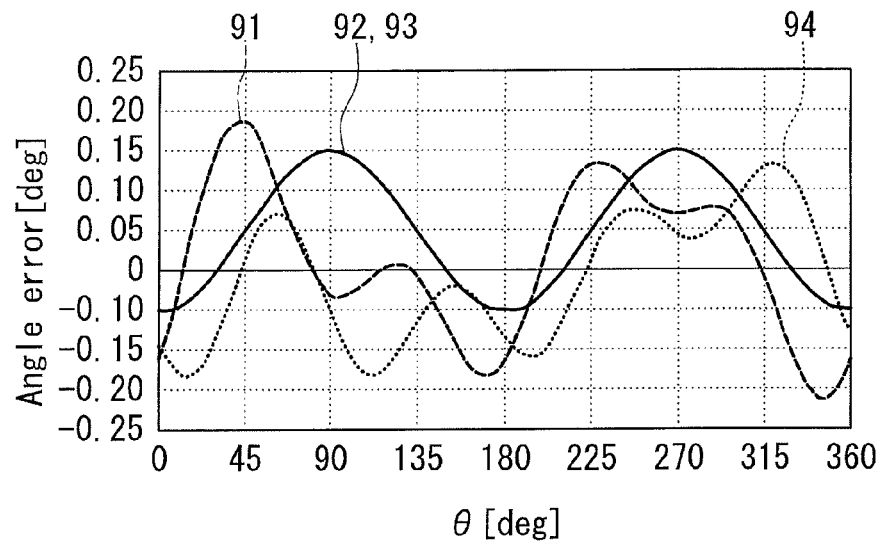
FIG. 10 is a waveform diagram illustrating an example of angle errors contained in angle values in the first embodiment of the invention.

FIG. 10 is a waveform diagram illustrating an example of the angle errors of the angle values $\theta s1$ to $\theta s4$ when the first detection circuit 10 fails. In FIG. 10, the horizontal axis represents angle $\theta$, and the vertical axis represents the magnitude of the angle errors. The waveforms labeled 91, 92, 93 and 94 indicate the angle errors of the angle values $\theta s1$, $\theta s2$, $\theta s3$ and $\theta s4$, respectively. In this example, the angle errors 92 and 93 of the angle values $\theta s2$ and $\theta s3$ are identical with each other. In contrast, the angle errors 91 and 94 of the angle values $\theta s1$ and $\theta s4$ are distinctly different from each other and distinctly different from the angle errors 92 and 93 of the angle values $\theta s2$ and $\theta s3$.

According to the rotating field sensors 1 of the first and second practical examples and the angle determination methods of the first and second practical examples, the angle difference calculation unit 61 (the subtractor circuits 61A to 61D) calculates the angle differences $\theta A$ to $\theta D$. This is for the purpose of distinguishing two correct angle values from two incorrect angle values by using the following characteristics of the angle differences. An angle difference calculated for an angle value pair consisting of two correct angle values is zero or very close to zero. In contrast, an angle difference calculated for an angle value pair in which at least one of the two angle values is incorrect is greater than the angle difference calculated for the angle value pair consisting of two correct angle values. The rotating field sensors 1 of the first and second practical examples and the angle determination methods of the first and second practical examples utilize such characteristics of the angle differences to extract an angle difference that falls within a predetermined range from the four angle differences $\theta A$ to $\theta D$. Then, two angle values constituting an angle value pair corresponding to the extracted angle difference are determined to be correct angle values. The rotating field sensor 1 of the second practical example and the angle determination method of the second practical example further determine the other two angle values than the two correct angle values to be incorrect angle values. Then, a detection circuit that is included in two groups that correspond to the two incorrect angle values and not included in the other two groups corresponding to the two correct angle values is identified as the failed detection circuit.

Figure 11:
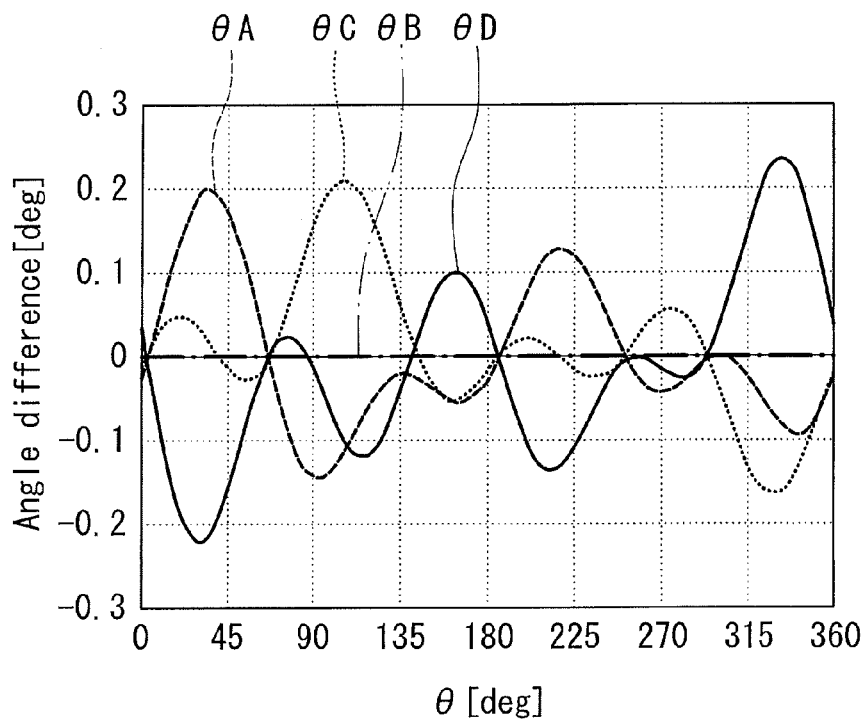
FIG. 11 is a waveform diagram illustrating an example of angle differences in the first embodiment of the invention.

FIG. 11 is a waveform diagram illustrating an example of the angle differences $\theta A$ to $\theta D$ when the first detection circuit 10 fails. In FIG. 11, the horizontal axis represents angle $\theta$, and the vertical axis represents the magnitude of the angle differences. In this example, the angle difference $\theta B$ calculated for the angle value pair consisting of the correct angle values $\theta s2$ and $\theta s3$ remains at zero regardless of the angle $\theta$. In contrast, the angle differences $\theta A$, $\theta C$ and $\theta D$ calculated for the angle value pairs that each include at least one of the incorrect angle values $\theta s1$ and $\theta s4$ do not remain at zero regardless of the angle $\theta$, but vary with changes in the angle $\theta$.

The determination unit 62 extracts an angle difference that falls within a predetermined range from the four angle differences $\theta A$ to $\theta D$. For example, the predetermined range is from −0.01° to 0.01° inclusive. The determination unit 62 determines angle values that constitute the angle value pair corresponding to the extracted angle difference to be correct angle values, and determines the other angle values to be incorrect angle values. According to the angle determination method of the second practical example, the determination unit 62 identifies a detection circuit that is included in two groups that correspond to the two incorrect angle values and not included in the other two groups corresponding to the two correct angle values as the failed detection circuit.

In the example shown in FIG. 11, $\theta B$ is extracted as the angle difference falling within the predetermined range. The angle values that constitute the angle value pair corresponding to θB are θs2 and θs3. Thus, θs2 and θs3 are determined to be correct angle values, whereas θs1 and θs4, which are other than θs2 and θs3, are determined to be incorrect angle values. The first group corresponding to θs1 consists of the first and second detection circuits 10 and 20. The fourth group corresponding to θs4 consists of the fourth and first detection circuits 40 and 10. In this case, the first detection circuit 10, which is included in the two groups corresponding to the two incorrect angle values θs1 and θs4 and not included in the other two groups corresponding to the two correct angle values θs2 and θs3, is identified as the failed detection circuit.

If none of the detection circuit 10, 20, 30 and 40 fails, all the four angle differences θA to θD always fall within a predetermined range regardless of the angle θ. In this case, the determination unit 62 determines all the four angle values θs1 to θs4 to be correct angle values.

Now, how the angle detection value θs is determined by the angle output unit 63 in steps S102C and S102F shown in FIGS. 7 and 8 will be described. If none of the detection circuits 10, 20, 30 and 40 fails, the determination unit 62 determines all the four angle values θs1 to θs4 to be correct angle values. If one of the first to fourth detection circuits 10, 20, 30 and 40 fails, the determination unit 62 determines two of the four angle values θs1 to θs4 to be incorrect angle values and the remaining two to be correct angle values. The angle output unit 63 determines the angle detection value θs on the basis of the plurality of correct angle values according to a predetermined rule. Examples of the predetermined rule include a rule that an average value of the plurality of correct angle values is determined to be the angle detection value θs, and a rule that with each angle value expressed as θsr (r is an integer between 1 and 4 inclusive), one of the plurality of correct angle values that has the smallest r is determined to be the angle detection value θs. If all the four angle values θs1 to θs4 are determined to be correct angle values, the angle output unit 63 may output an average value of θs1 to θs4 as the angle detection value θs, or output θs1 as the angle detection value θs, for example. If, for example, θs1 and θs4 are determined to be incorrect angle values while θs2 and θs3 are determined to be correct angle values, the angle output unit 63 may output an average value of θs2 and θs3 as the angle detection value θs, or output θs2 as the angle detection value θs, for example.

In the rotating field sensors 1 of the first and second practical examples and the angle determination methods of the first and second practical examples described above, n is four, m is two, and g is four. However, the rotating field sensor 1 and the angle determination method according to the first embodiment need only satisfy the foregoing requirements 1 to 4 in order to be able to output a correct angle detection value θs even in the case of a failure of one of the detection circuits, or need only satisfy the foregoing requirements 1 to 6 in order to be able to further identify the failed detection circuit.

As described above, the angle calculation unit calculates each of the g angle values corresponding to the g groups on the basis of the m output signals of the m detection circuits constituting a corresponding one of the g groups. Now, a description will be given of an example of the method for calculating the g angle values when m is three or greater. According to this method, g angle calculation circuits having the same configuration as the angle calculation circuits 51 to 54 shown in FIG. 5 are prepared in correspondence to the g groups. In each group, two subgroups each consisting of at least one and not more than (m−1) detection circuits are formed. Each of the m detection circuits is used to constitute at least one of the two subgroups. Each subgroup generates a subgroup signal. If a subgroup consists of only one detection circuit, the output signal of the detection circuit may be simply used as the subgroup signal of the subgroup. If a subgroup consists of a plurality of detection circuits, the subgroup signal of the subgroup is generated by a computation using the output signals of the plurality of detection circuits, such as a computation for determining the sum, difference, or the like. In such a manner, each group generates two subgroup signals. According to such a method, the two subgroup signals of each group are supplied to two inputs of the angle calculation circuit corresponding to the group. On the basis of the two subgroup signals supplied to the two inputs, the angle calculation circuit then calculates an angle value having a correspondence relationship with the angle θ, like the angle calculation circuits 51 to 54.

To accurately calculate the angle value, if m is two, the phase difference between the two output signals of the two detection circuits constituting each group preferably has an absolute value other than 0° and 180°, and somewhat away from each of 0° and 180°. Specifically, the aforementioned phase difference preferably has an absolute value in the range of 15° to 165°, more preferably 30° to 150°. In the example shown in FIG. 3, the phase difference between the output signals S1 and S2 of the first and second detection circuits 10 and 20 constituting the first group, the phase difference between the output signals S2 and S3 of the second and third detection circuits 20 and 30 constituting the second group, and the phase difference between the output signals S3 and S4 of the third and fourth detection circuits 30 and 40 constituting the third group each have an absolute value of 45°. The phase difference between the output signals S4 and S1 of the fourth and first detection circuits 40 and 10 constituting the fourth group has an absolute value of 135°. All of these phase differences satisfy the aforementioned condition.

Similarly, if m is three or greater, the phase difference between the two subgroup signals of each group preferably has an absolute value in the range of 15° to 165°, more preferably 30° to 150°. In this case, the m detection circuits constituting a group may include such detection circuits that the phase difference between their output signals has an absolute value of 0° or 180°, as long as the two subgroup signals satisfy the aforementioned condition.

Figure 12:
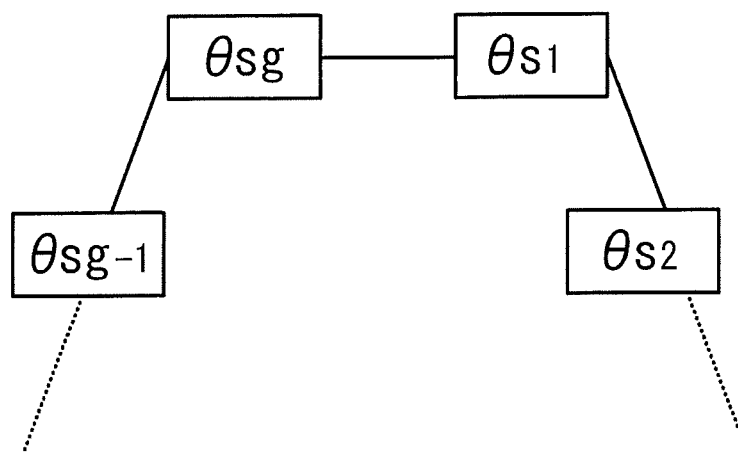
FIG. 12 is an explanatory diagram schematically illustrating combinations of two angle values to constitute angle value pairs.

If the number of angle values is g, the number of angle value pairs may be g or greater than g. FIG. 12 is an explanatory diagram schematically illustrating an example of combinations of two angle values constituting an angle value pair when the number of angle values and the number of angle value pairs are both g. In FIG. 12, θs1, θs2, θsg−1, and θsg represent the first angle value, the second angle value, the (g−1)-th angle value, and the g-th angle value among the g angle values, respectively. As shown in FIG. 12, possible combinations of two angle values constituting an angle value pair include a combination of θs1 and θs2, . . . , a combination of θsg−1 and θsg, and a combination of θsg and θs1. In this case, each of the g angle values is used to constitute two of the g angle value pairs. If the number of angle value pairs is greater than g, at least two of the g angle values are used to constitute three or more angle value pairs.

Now, the rotating field sensor 1 and the angle determination method according to the first embodiment will be described in a conceptual manner with a detailed description of the meanings of the foregoing requirements 1 to 6. Requirements 1 to 6 are as follows. Requirement 1 is that m be an integer not less than two. Requirement 2 is that n be an integer greater than m by two or more. Requirement 3 is that g be an integer not less than three and not more than $_nC_m$. Requirement 4 is that each of the n detection circuits be used to constitute at least one and not more than (g−2) of the g groups. Requirement 5 is that g be greater than m by two or more and be not less than (n−m+1). Requirement 6 is that the g groups be formed of such combinations of detection circuits that in the case of a failure of whichever one of the n detection circuits, there is no detection circuit other than the failed detection circuit that is included in all ones of the g groups that include the failed detection circuit and included in none of the other ones of the g groups.

Requirements 1 to 4 are needed in order that a correct angle detection value θs can be output even if one of the n detection circuits fails, as with the rotating field sensor 1 in the first mode and the angle determination method in the first mode. Requirements 1 to 6 are needed in order that a correct angle detection value θs can be output and a failed detection circuit can be identified in the case of a failure of one of the n detection circuits, as with the rotating field sensor 1 in the second mode and the angle determination method in the second mode.

Requirement 1 is needed to calculate an angle value on the basis of the output signals of a plurality of detection circuits.

As described below, requirement 2 is needed to identify a correct angle value in the case of a failure of one of n detection circuits. In order to obtain one or more correct angle values even in the case of a failure of one of the n detection circuits, n needs to be an integer greater than m. If there is only one correct angle value to be obtained in the case of a failure of one of the n detection circuits, it is not possible to know which of the g angle values is the correct angle value. If there are a plurality of correct angle values to be obtained in the case of a failure of one of the n detection circuits, it is possible to identify the plurality of correct angle values by using the characteristic that the correct angle values are identical with or very close to each other. If n is an integer greater than m by two or more, it is possible to obtain a plurality of correct angle values even if one of the n detection circuits fails. Requirement 2 is therefore needed to make it possible to obtain a plurality of correct angle values and identify them in the case of a failure of one of the n detection circuits.

Assuming that requirements 1 and 2 are satisfied, it is possible to obtain a plurality of correct angle values even in the case of a failure of one of the n detection circuits if requirements 3 and 4 are further satisfied. Requirements 3 and 4 are therefore also needed to make it possible to obtain a plurality of correct angle values and identify them in the case of a failure of one of the n detection circuits.

Note that $_nC_m$ in requirement 3 is the total number of combinations of m detection circuits to be selected from the n detection circuits, and is expressed by the following equation.

$$_nC_m = \{n \times (n-1) \times \ldots \times (n-m+1)\} / \{m \times (m-1) \times \ldots \times 1\}$$

Requirements 5 and 6 will be described in detail below. Requirement 6 will be described first. Suppose that any one of the n detection circuits fails. In this case, if there are a plurality of detection circuits that are included in all ones of the g groups that include the failed detection circuit and included in none of the other ones of the g groups, it is not possible to determine which of the plurality of detection circuits is the failed detection circuit. On the other hand, if there is no detection circuit other than the failed detection circuit that is included in all ones of the g groups that include the failed detection circuit and included in none of the other ones of the g groups, it is possible to identify the failed detection circuit regardless of whichever one of the n detection circuits fails. Requirement 6 is therefore needed to allow for identification of the failed detection circuit in the case of a failure of one of the n detection circuits.

Requirement 5 will now be described in detail with reference to a plurality of specific examples. Requirement 5 is a requirement for g to satisfy in order for requirement 6 to be satisfied. Requirement 5 requires satisfaction of both of a requirement that g be greater than m by two or more (hereinafter referred to as requirement 5-1) and a requirement that g be not less than (n−m+1) (hereinafter, referred to as requirement 5-2).

In the following description, the n detection circuits will be denoted by respective integer numbers of 1 to n. Each group of detection circuits will be denoted by the parenthesized numbers of a plurality of detection circuits constituting the group. For example, a group of two detection circuits numbered 1 and 2 is expressed as (1, 2). A group of three detection circuits numbered 1, 2 and 3 is expressed as (1, 2, 3).

[If n is Four]

From requirements 1 and 2, the minimum value of n is four. First, the case where n is four will be considered. If n is four, the only possible value of m that satisfies requirements 1 and 2 is two. If n is four and m is two, g being 3 cannot form a plurality of groups that satisfy requirements 1 to 4 and 6. If n is four and m is two, g being four or greater allows for forming a plurality of groups that satisfy requirements 1 to 4 and 6. If n is four, m is two and g is three, requirement 5-2 is satisfied but requirement 5-1 is not. If n is four, m is two and g is four or greater, both of requirements 5-1 and 5-2 are satisfied.

For the case where n is four, m is two and g is four, examples of the four groups include the following example 1.

Example 1: (1, 2), (2, 3), (3, 4), and (4, 1)

The rotating field sensor 1 shown in FIG. 3 and FIG. 4 is configured according to example 1.

Figure 13:
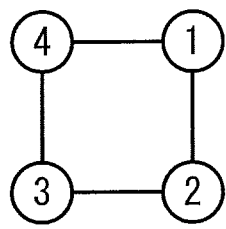
FIG. 13 is an explanatory diagram schematically illustrating an example of combinations of detection circuits to form a plurality of groups of two detection circuits selected from four detection circuits.

Now, the combinations of detection circuits in the four groups in example 1 will be schematically described with reference to FIG. 13. FIG. 13 is an explanatory diagram schematically illustrating an example of combinations of detection circuits to form a plurality of groups of two detection circuits selected from four detection circuits. In FIG. 13, the circles with numerals represent the detection circuits having the numbers corresponding to the numerals. In FIG. 13, two detection circuits constituting each of the four groups in example 1 are connected by a solid line. As seen from FIG. 13, a rectangle is drawn if two circles representing two detection circuits constituting each group are connected by a solid line and the circles are transformed into points.

[If n is Five]

Next, the case where n is five will be considered. If n is five, possible values of m that satisfy requirements 1 and 2 are two and three.

If n is five and m is two, g being four or greater allows for forming a plurality of groups that satisfy requirements 1 to 4 and 6. If n is five, m is two and g is three, neither of requirements 5-1 and 5-2 is satisfied. If n is five, m is two and g is four or greater, both of requirements 5-1 and 5-2 are satisfied.

For the case where n is five, m is two and g is four, examples of the four groups include the following example 2.

Example 2: (1, 2), (2, 3), (3, 4), and (4, 5)

For the case where n is five, m is two and g is five, examples of the five groups include the following example 3.

Example 3: (1, 2), (2, 3), (3, 4), (4, 5), and (5, 1)

Figure 14:
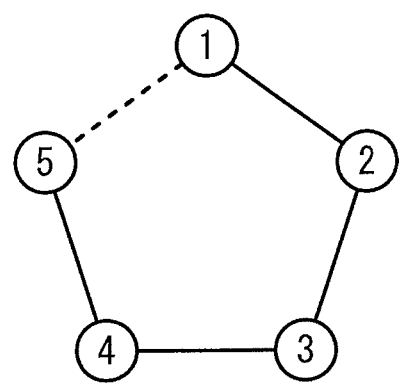
FIG. 14 is an explanatory diagram schematically illustrating two examples of combinations of detection circuits to form a plurality of groups of two detection circuits selected from five detection circuits.

The combinations of detection circuits in the four or five groups in example 2 or 3 will be schematically described with reference to FIG. 14. FIG. 14 is an explanatory diagram schematically illustrating two examples of combinations of detection circuits to form a plurality of groups of two detection circuits selected from five detection circuits. In FIG. 14, the circles with numerals represent the detection circuits having the numbers corresponding to the numerals. In FIG. 14, two circles representing two detection circuits constituting each of the groups (1, 2), (2, 3), (3, 4), and (4, 5) listed in examples 2 and 3 are connected by a solid line, and two circles representing the two detection circuits constituting the group (5, 1) listed in example 3 are connected by a broken line. As seen from FIG. 14, if two circles representing two detection circuits constituting each group are connected by a solid line and the circles are transformed into points, four sides of a pentagon are drawn for example 2 and a pentagon is drawn for example 3.

In example 2, requirement 4 is satisfied as follows. Three of the five detection circuits are each used to constitute two of the four groups. The remaining two of the five detection circuits are each used to constitute one of the four groups.

If n is five and m is three, g being five or greater allows for forming a plurality of groups that satisfy requirements 1 to 4 and 6. If n is five, m is three and g is four, requirement 5-2 is satisfied but requirement 5-1 is not. If n is five, m is three and g is five or greater, both of requirements 5-1 and 5-2 are satisfied.

For the case where n is five, m is three and g is five, examples of the five groups include the following example 4.

Example 4: (1, 2, 3), (2, 3, 4), (3, 4, 5), (4, 5, 1), and (5, 1, 2)

[If n is Six]

Next, the case where n is six will be considered. If n is six, possible values of m that satisfy requirements 1 and 2 are two, three, and four.

If n is six and m is two, g being five or greater allows for forming a plurality of groups that satisfy requirements 1 to 4 and 6. If n is six, m is two and g is four, requirement 5-1 is satisfied but requirement 5-2 is not. If n is six, m is two and g is five or greater, both of requirements 5-1 and 5-2 are satisfied.

If n is four or five, requirement 5-2 is satisfied when requirement 5-1 is satisfied. If n is six or greater, there arises a case where requirement 5-1 is satisfied but requirement 5-2 is not, as described above. If requirement 5-1 is satisfied but requirement 5-2 is not, it is not possible to form a plurality of groups that satisfy requirements 1 to 4 and 6. Requirement 5 therefore requires satisfaction of both of requirements 5-1 and 5-2.

For the case where n is six, m is two and g is five, examples of the five groups include the following example 5.

Example 5: (1, 2), (2, 3), (3, 4), (4, 5), and (5, 6)

For the case where n is six, m is two and g is six, examples of the six groups include the following example 6.

Example 6: (1, 2), (2, 3), (3, 4), (4, 5), (5, 6), and (6, 1)

Although not illustrated, drawing a figure in the same manner as FIGS. 13 and 14 can draw five sides of a hexagon for example 5, and a hexagon for example 6.

For the case where n is six and m is two, suppose that one of the n detection circuits fails. In such a case, if the failed detection circuit need not be identified and a correct angle detection value θs need only be output, it is not necessary to satisfy requirement 5, and g may be three, for example. An example of the three groups in such a case is (1, 2), (3, 4) and (5, 6).

If n is six and m is three, g being five or greater allows for forming a plurality of groups that satisfy requirements 1 to 4 and 6. If n is six, m is three and g is four, requirement 5-2 is satisfied but requirement 5-1 is not. If n is six, m is three and g is five or greater, both of requirements 5-1 and 5-2 are satisfied.

For the case where n is six, m is three and g is five, examples of the five groups include the following example 7.

Example 7: (1, 2, 3), (2, 3, 4), (3, 4, 5), (4, 5, 6), and (5, 6, 1)

If n is six and m is four, g being six or greater allows for forming a plurality of groups that satisfy requirements 1 to 4 and 6. If n is six, m is four and g is five, requirement 5-2 is satisfied but requirement 5-1 is not. If n is six, m is four and g is six or greater, both of requirements 5-1 and 5-2 are satisfied.

For the case where n is six, m is four and g is six, examples of the six groups include the following example 8.

Example 8: (1, 2, 3, 4), (2, 3, 4, 5), (3, 4, 5, 6), (4, 5, 6, 1), (5, 6, 1, 2), and (6, 1, 2, 3)

[If n is Eight]

Next, the case where n is eight will be considered. If n is eight, possible values of m that satisfy requirements 1 and 2 are integers between two and six inclusive.

If n is eight and m is two, g being seven or greater allows for forming a plurality of groups that satisfy requirements 1 to 4 and 6. If n is eight, m is two and g is six, requirement 5-1 is satisfied but requirement 5-2 is not. If n is eight, m is two and g is seven or greater, both of requirements 5-1 and 5-2 are satisfied.

For the case where n is eight, m is two and g is seven, examples of the seven groups include the following example 9.

Example 9: (1, 2), (2, 3), (3, 4), (4, 5), (5, 6), (6, 7), and (7, 8)

For the case where n is eight, m is two and g is eight, examples of the eight groups include the following example 10.

Example 10: (1, 2), (2, 3), (3, 4), (4, 5), (5, 6), (6, 7), (7, 8), and (8, 1)

Although not illustrated, drawing a figure in the same manner as FIGS. 13 and 14 can draw seven sides of an octagon for example 9, and an octagon for example 10.

For the case where n is eight and m is two, suppose that one of the n detection circuits fails. In such a case, if the failed detection circuit need not be identified and a correct angle detection value θs need only be output, it is not necessary to satisfy requirement 5, and g may be four, for example. An example of the four groups in such a case is (1, 2), (3, 4), (5, 6), and (7, 8). If n is eight and m is three, g being six or greater allows for forming a plurality of groups that satisfy requirements 1 to 4 and 6. If n is eight, m is three and g is five, requirement 5-1 is satisfied but requirement 5-2 is not. If n is eight, m is three and g is six or greater, both of requirements 5-1 and 5-2 are satisfied.

For the case where n is eight, m is three and g is six, examples of the six groups include the following example 11.

Example 11: (1, 2, 3), (2, 3, 4), (3, 4, 5), (4, 5, 6), (5, 6, 7), and (6, 7, 8)

If n is eight and m is four, g being six or greater allows for forming a plurality of groups that satisfy requirements 1 to 4 and 6. If n is eight, m is four and g is five, requirement 5-2 is satisfied but requirement 5-1 is not. If n is eight, m is four and g is six or greater, both of requirements 5-1 and 5-2 are satisfied.

For the case where n is eight, m is four and g is six, examples of the six groups include the following example 12.

Example 12: (1, 2, 3, 4), (2, 3, 4, 5), (3, 4, 5, 6), (4, 5, 6, 7), (5, 6, 7, 8), and (6, 7, 8, 1)

Suppose that n is eight and m is five or six. In such a case also, a plurality of groups that satisfy requirements 1 to 4 and 6 can be formed when both of requirements 5-1 and 5-2 are satisfied. Examples thereof are omitted.

If n is seven or if n is nine or greater, a plurality of groups that satisfy requirements 1 to 4 and 6 can also be formed when both of requirements 5-1 and 5-2 are satisfied. Examples thereof are omitted.

Even if requirements 1 to 5 are satisfied, there can be a plurality of such groups that a failed detection circuit is not identifiable when any one of the n detection circuits fails. An example of such groups is (I, 2, 3), (1, 2, 4), (1, 2, 5), (1, 2, 6), (3, 7, 8), and (4, 7, 8) where n is eight, m is four and g is six.

A conceptual description will be given concerning the above. Suppose that a plurality of groups are formed such that if any one of the n detection circuits fails, there can be a plurality of detection circuits that are included in all groups that include the failed detection circuit and included in none of the other groups. In such a case, the failed detection circuit may sometimes be not identifiable. In the foregoing example, if the detection circuit numbered 1 or 2 fails, all the groups that include the failed detection circuit are (1, 2, 3), (1, 2, 4), (1, 2, 5), and (1, 2, 6). All the other groups are (3, 7, 8) and (4, 7, 8). In this case, two detection circuits, i.e., the detection circuits numbered 1 and 2, are included in all the groups that include the failed detection circuit and not included in the other groups. Which of the two detection circuits is the failed detection circuit is thus not identifiable.

Consequently, in order for the failed detection circuit to be identifiable when one of the n detection circuits fails, requirement 6 is needed in addition to requirements 1 to 5.

In the first embodiment, requirement 4 may be narrowed into requirement 4A below, and a plurality of groups may be formed to satisfy requirements 1 to 3, 4A, and 5.

Requirement 4A: Each of the n detection circuits be used to constitute at least two and not more than (g−2) of the g groups.

With m being two, g groups may be formed to satisfy requirements 1 to 3, 4A and 5 on the precondition that the g groups do not include two or more groups formed of the same combination of two detection circuits. This makes the resulting g groups satisfy requirement 6 even if no consideration is given to satisfaction of requirement 6. Consequently, if m is two, employing requirement 4A instead of requirement 4 facilitates forming a plurality of such groups that a failed detection circuit is identifiable when one of the n detection circuits fails. Examples of groups that satisfy requirements 1 to 3, 4A, and 5 include the foregoing examples 1, 3, 6, and 10.

With the rotating field sensor 1 according to the first embodiment, even if one of the n detection circuits fails, a plurality of angle values corresponding to a plurality of ones of the g groups that do not include the failed detection circuit are correct angle values among the g angle values. The plurality of correct angle values are identical with or very close to each other, and are thus extractable. The angle detection value θs is determinable on the basis of at least one of the plurality of correct angle values. The rotating field sensor 1 according to the first embodiment is thus able to output a correct angle detection value θs even in the case of a failure of one of the detection circuits.

According to the rotating field sensor 1 in the first mode, the angle determination unit (the control unit 60) is able to output a correct angle detection value θs even if one of the detection circuits fails. According to the rotating field sensor 1 in the second mode, in the case of a failure of one of the detection circuits, the failure detection unit (the control unit 60) is able to output a correct angle detection value θs and identify the failed detection circuit.

The angle determination method according to the first embodiment calculates the g angle values in correspondence to the g groups, and determines the angle detection value by using the g angle values. As described above, even if one of the n detection circuits fails, a plurality of angle values corresponding to a plurality of ones of the g groups that do not include the failed detection circuit are correct angle values among the g angle values. The angle determination method according to the first embodiment can thus determine a correct angle detection value θs by using the rotating field sensor 1 even if one of the detection circuits fails. The angle determination method in the second mode further allows for identification of the failed detection circuit when one of the n detection circuits fails.

A failed detection circuit generates an output signal different from that when the detection circuit is normal. A method for detecting a failure of a detection circuit by monitoring the output signal thereof is not capable of detecting the failure of the detection circuit with high sensitivity. More specifically, by such a method, it is difficult to detect such a failure of a detection circuit that the output signal of the detection circuit deviates from a predetermined normal value by a relatively small amount.

According to the first embodiment, in contrast, a failed detection circuit is identified on the basis of a plurality of angle values each calculated from the output signals of m detection circuits. Even in the case of such a failure of a detection circuit that the output signal of the detection circuit deviates from a predetermined normal value by a relatively small amount, the angle values change in a relatively noticeable manner as compared to normal time. The first embodiment is thus capable of detecting a failure of a detection circuit with higher sensitivity than the method for detecting a failure of a detection circuit by monitoring the output signal thereof.

Second Embodiment

Figure 15:
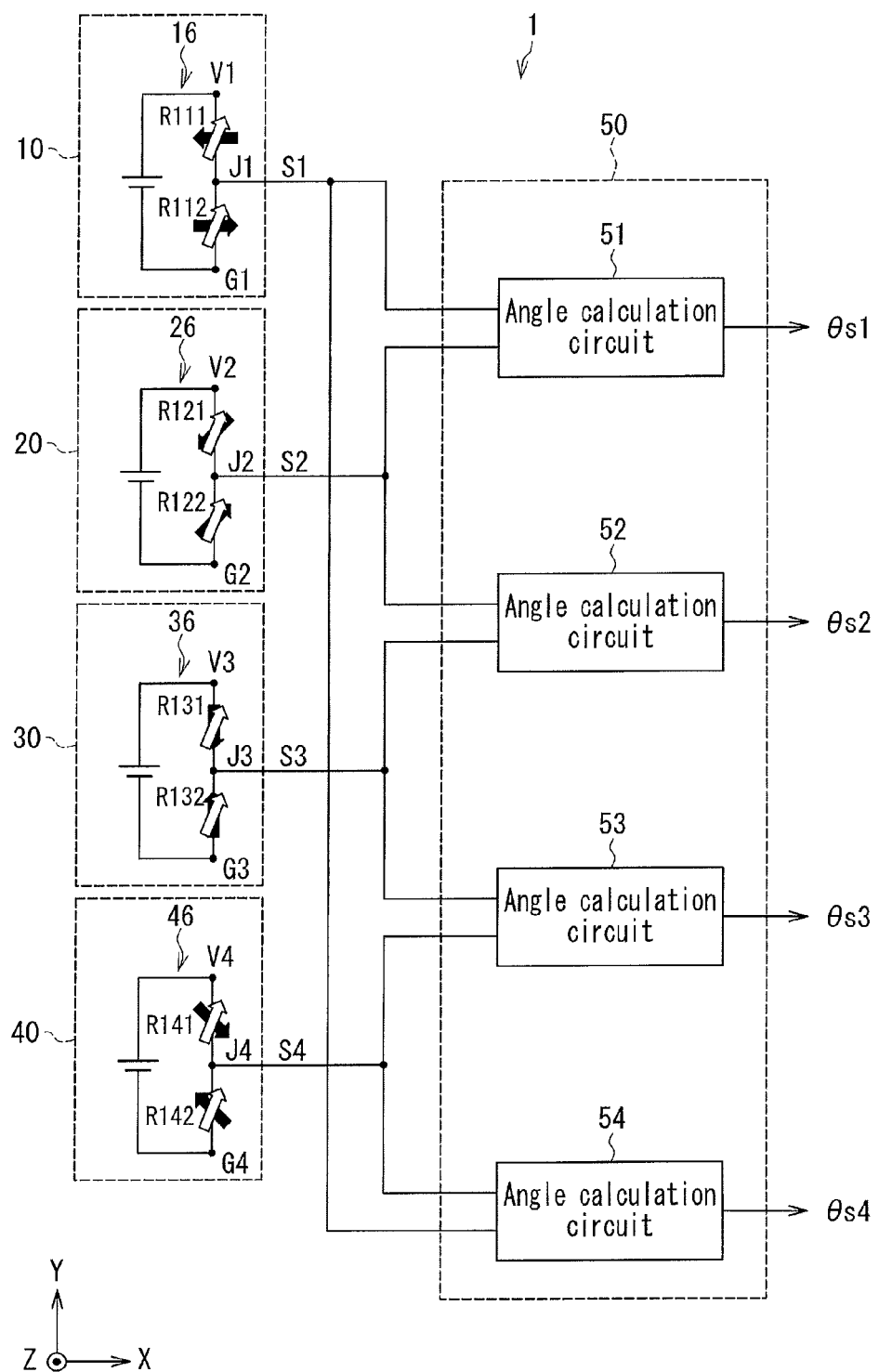
FIG. 15 is a circuit diagram illustrating a portion of a rotating field sensor according to a second embodiment of the invention.

A rotating field sensor according to a second embodiment of the invention will now be described with reference to FIG. 15. FIG. 15 is a circuit diagram illustrating the configuration of a portion of the rotating field sensor according to the second embodiment. In the second embodiment, the first detection circuit 10 includes a half-bridge circuit 16 in place of the Wheatstone bridge circuit 14 and the difference detector 15. The half-bridge circuit 16 includes a pair of serially connected MR elements R111 and R112. An end of the MR element R111 farther from the MR element R112 is connected to the power supply port V1. An end of the MR element R112 farther from the MR element R111 is connected to the ground port G1. The first output signal S1 is output from a junction J1 between the MR element R111 and the MR element R112.

The second detection circuit 20 includes a half-bridge circuit 26 in place of the Wheatstone bridge circuit 24 and the difference detector 25. The half-bridge circuit 26 includes a pair of serially connected MR elements R121 and R122. An end of the MR element R121 farther from the MR element R122 is connected to the power supply port V2. An end of the MR element R122 farther from the MR element R121 is connected to the ground port G2. The second output signal S2 is output from a junction J2 between the MR element R121 and the MR element R122.

The third detection circuit 30 includes a half-bridge circuit 36 in place of the Wheatstone bridge circuit 34 and the difference detector 35. The half-bridge circuit 36 includes a pair of serially connected MR elements R131 and R132. An end of the MR element R131 farther from the MR element R132 is connected to the power supply port V3. An end of the MR element R132 farther from the MR element R131 is connected to the ground port G3. The third output signal S3 is output from a junction J3 between the MR element R131 and the MR element R132.

The fourth detection circuit 40 includes a half-bridge circuit 46 in place of the Wheatstone bridge circuit 44 and the difference detector 45. The half-bridge circuit 46 includes a pair of serially connected MR elements R141 and R142. An end of the MR element R141 farther from the MR element R142 is connected to the power supply port V4. An end of the MR element R142 farther from the MR element R141 is connected to the ground port G4. The fourth output signal S4 is output from a junction J4 between the MR element R141 and the MR element R142.

The MR elements R111, R112, R121, R122, R131, R132, R141 and R142 are configured in the same manner as the MR elements R11, R12, R21, R22, R31, R32, R41 and R42 of the first embodiment. More specifically, in the first detection circuit 10, the magnetization direction of the magnetization pinned layer of the MR element R111 is the same as the first direction D1 (the −X direction) shown in FIG. 2 and described in the first embodiment section, and the magnetization direction of the magnetization pinned layer of the MR element R112 is opposite to that of the magnetization pinned layer of the MR element R111. In this case, the potential at the junction J1 varies depending on the relative angle between the direction DM of the rotating magnetic field MF and the first direction D1.

In the second detection circuit 20, the magnetization direction of the magnetization pinned layer of the MR element R121 is the same as the second direction D2 shown in FIG. 2 and described in the first embodiment section, and the magnetization direction of the magnetization pinned layer of the MR element R122 is opposite to that of the magnetization pinned layer of the MR element R121. In this case, the potential at the junction J2 varies depending on the relative angle between the direction DM of the rotating magnetic field MF and the second direction D2.

In the third detection circuit 30, the magnetization direction of the magnetization pinned layer of the MR element R131 is the same as the third direction D3 (the −Y direction) shown in FIG. 2 and described in the first embodiment section, and the magnetization direction of the magnetization pinned layer of the MR element R132 is opposite to that of the magnetization pinned layer of the MR element R131.

In this case, the potential at the junction J3 varies depending on the relative angle between the direction DM of the rotating magnetic field MF and the third direction D3.

In the fourth detection circuit 40, the magnetization direction of the magnetization pinned layer of the MR element R141 is the same as the fourth direction D4 shown in FIG. 2 and described in the first embodiment section, and the magnetization direction of the magnetization pinned layer of the MR element R142 is opposite to that of the magnetization pinned layer of the MR element R141. In this case, the potential at the junction J4 varies depending on the relative angle between the direction DM of the rotating magnetic field MF and the fourth direction D4.

In the second embodiment, the two inputs of the first angle calculation circuit 51 are connected to the junction J1 of the first detection circuit 10 and the junction J2 of the second detection circuit 20. The two inputs of the second angle calculation circuit 52 are connected to the junction J2 of the second detection circuit 20 and the junction J3 of the third detection circuit 30. The two inputs of the third angle calculation circuit 53 are connected to the junction J3 of the third detection circuit 30 and the junction J4 of the fourth detection circuit 40. The two inputs of the fourth angle calculation circuit 54 are connected to the junction J4 of the fourth detection circuit 40 and the junction J1 of the first detection circuit 10.

The other configuration, operation, and effects of the second embodiment are the same as those of the first embodiment.

Third Embodiment

Figure 16:
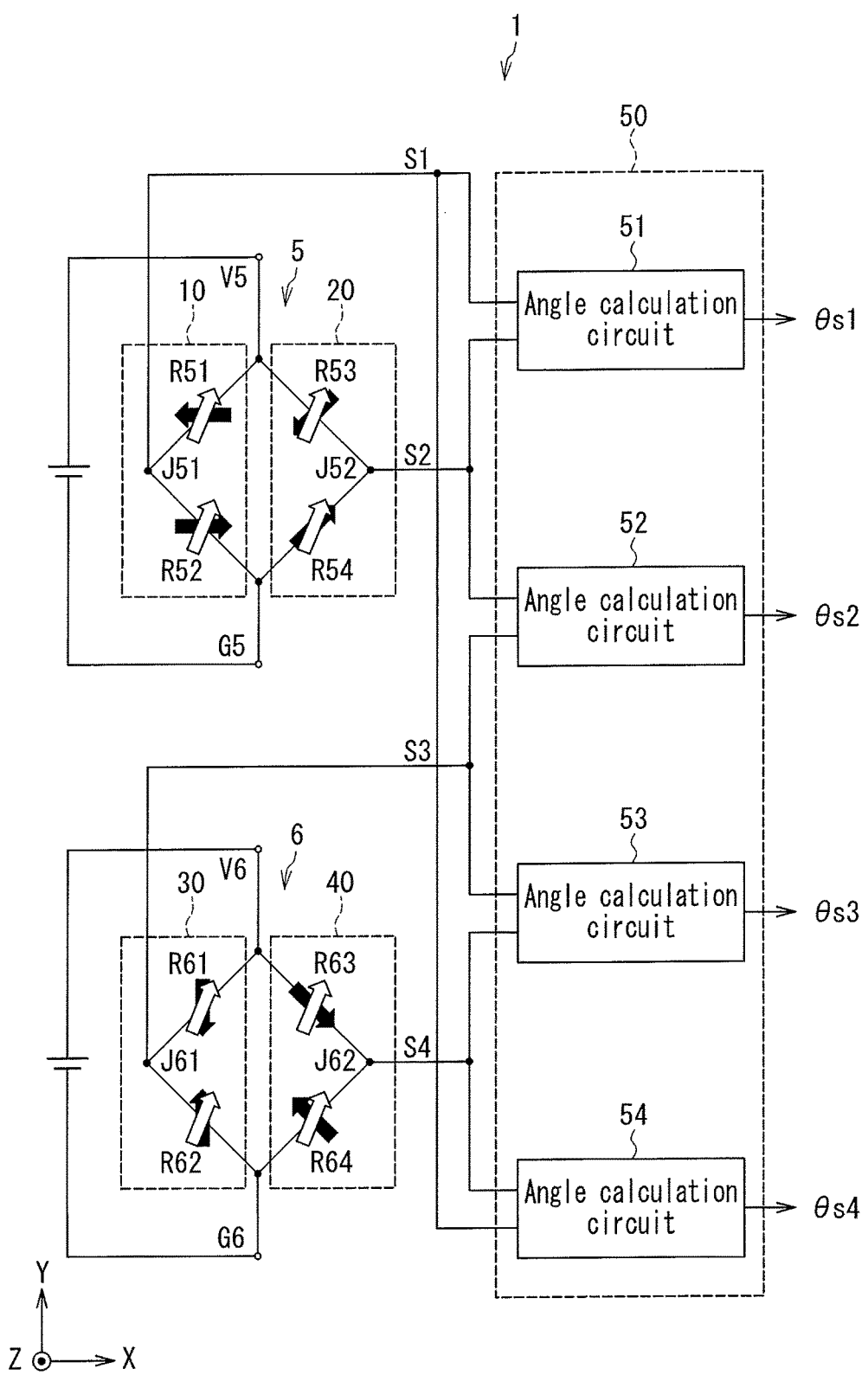
FIG. 16 is a circuit diagram illustrating a portion of a rotating field sensor according to a third embodiment of the invention.

A rotating field sensor according to a third embodiment of the invention will now be described with reference to FIG. 16. FIG. 16 is a circuit diagram illustrating the configuration of a portion of the rotating field sensor according to the third embodiment. The rotating field sensor 1 according to the third embodiment includes two Wheatstone bridge circuits 5 and 6 in place of the Wheatstone bridge circuits 14, 24, 34 and 44 of the first embodiment. The rotating field sensor 1 further includes power supply ports V5 and V6 and ground ports G5 and G6.

The Wheatstone bridge circuit 5 includes a first pair of serially connected MR elements R51 and R52 and a second pair of serially connected MR elements R53 and R54. An end of the MR element R51 farther from the MR element R52 is connected to an end of the MR element R53 farther from the MR element R54 and to the power supply port V5. An end of the MR element R52 farther from the MR element R51 is connected to an end of the MR element R54 farther from the MR element R53 and to the ground port G5. A predetermined voltage is applied between the power supply port V5 and the ground port G5. As a result, a predetermined voltage is applied between the end of the MR element R51 and the end of the MR element R52 farther from each other, and between the end of the MR element R53 and the end of the MR element R54 farther from each other.

The Wheatstone bridge circuit 6 includes a first pair of serially connected MR elements R61 and R62 and a second pair of serially connected MR elements R63 and R64. An end of the MR element R61 farther from the MR element R62 is connected to an end of the MR element R63 farther from the MR element R64 and to the power supply port V6. An end of the MR element R62 farther from the MR element R61 is connected to an end of the MR element R64 farther from the MR element R63 and to the ground port G6. A predetermined voltage is applied between the power supply port V6 and the ground port G6. As a result, a predetermined voltage is applied between the end of the MR element R61 and the end of the MR element R62 farther from each other, and between the end of the MR element R63 and the end of the MR element R64 farther from each other.

In the third embodiment, the first detection circuit 10 is composed of the MR elements R51 and R52. The second detection circuit 20 is composed of the MR elements R53 and R54. The third detection circuit 30 is composed of the MR elements R61 and R62. The fourth detection circuit 40 is composed of the MR elements R63 and R64. The first output signal S1 is output from a junction J51 between the MR element R51 and the MR element R52. The second output signal S2 is output from a junction J52 between the MR element R53 and the MR element R54. The third output signal S3 is output from a junction J61 between the MR element R61 and the MR element R62. The fourth output signal S4 is output from a junction J62 between the MR element R63 and the MR element R64.

The MR elements R51, R52, R53, R54, R61, R62, R63 and R64 are configured in the same manner as the MR elements R11, R12, R21, R22, R31, R32, R41 and R42 of the first embodiment. More specifically, in the first detection circuit 10, the magnetization direction of the magnetization pinned layer of the MR element R51 is the same as the first direction D1 (the −X direction) shown in FIG. 2 and described in the first embodiment section, and the magnetization direction of the magnetization pinned layer of the MR element R52 is opposite to that of the magnetization pinned layer of the MR element R51. In this case, the potential at the junction J51 varies depending on the relative angle between the direction DM of the rotating magnetic field MF and the first direction D1.

In the second detection circuit 20, the magnetization direction of the magnetization pinned layer of the MR element R53 is the same as the second direction D2 shown in FIG. 2 and described in the first embodiment section, and the magnetization direction of the magnetization pinned layer of the MR element R54 is opposite to that of the magnetization pinned layer of the MR element R53. In this case, the potential at the junction J52 varies depending on the relative angle between the direction DM of the rotating magnetic field MF and the second direction D2.

In the third detection circuit 30, the magnetization direction of the magnetization pinned layer of the MR element R61 is the same as the third direction D3 (the −Y direction) shown in FIG. 2 and described in the first embodiment section, and the magnetization direction of the magnetization pinned layer of the MR element R62 is opposite to that of the magnetization pinned layer of the MR element R61. In this case, the potential at the junction J61 varies depending on the relative angle between the direction DM of the rotating magnetic field MF and the third direction D3.

In the fourth detection circuit 40, the magnetization direction of the magnetization pinned layer of the MR element R63 is the same as the fourth direction D4 shown in FIG. 2 and described in the first embodiment section, and the magnetization direction of the magnetization pinned layer of the MR element R64 is opposite to that of the magnetization pinned layer of the MR element R63. In this case, the potential at the junction J62 varies depending on the relative angle between the direction DM of the rotating magnetic field MF and the fourth direction D4.

In the third embodiment, the two inputs of the first angle calculation circuit 51 are connected to the junctions J51 and J52 of the Wheatstone bridge circuit 5. The two inputs of the second angle calculation circuit 52 are connected to the junction J52 of the Wheatstone bridge circuit 5 and the junction J61 of the Wheatstone bridge circuit 6. The two inputs of the third angle calculation circuit 53 are connected to the junctions J61 and J62 of the Wheatstone bridge circuit 6. The two inputs of the fourth angle calculation circuit 54 are connected to the junction J62 of the Wheatstone bridge circuit 6 and the junction J51 of the Wheatstone bridge circuit 5.

The other configuration, operation, and effects of the third embodiment are the same as those of the first embodiment.

Fourth Embodiment

Figure 17:
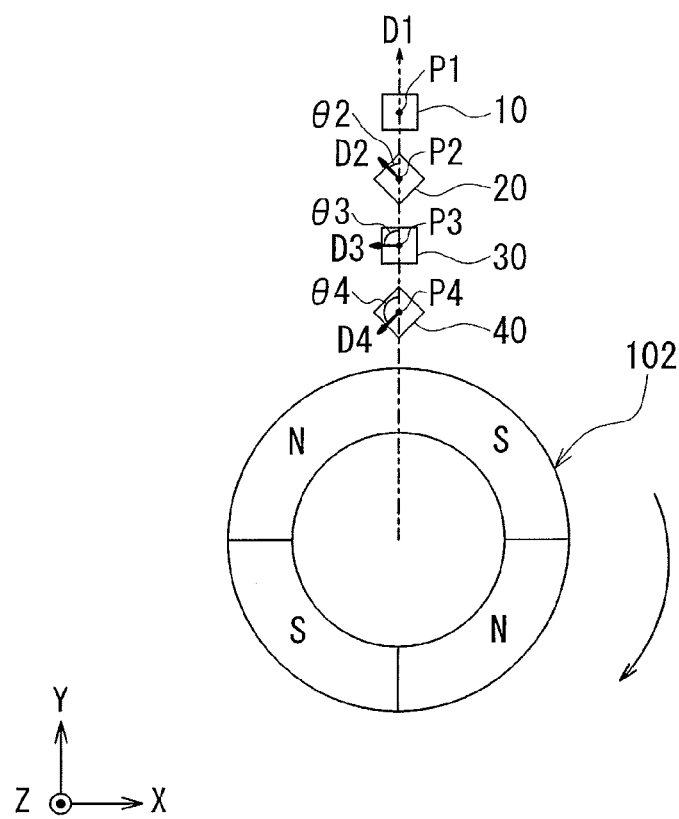
FIG. 17 is an explanatory diagram illustrating the configuration of a rotating field sensor according to a fourth embodiment of the invention.

A rotating field sensor according to a fourth embodiment of the invention will now be described with reference to FIG. 17. FIG. 17 is an explanatory diagram illustrating the configuration of the rotating field sensor according to the fourth embodiment. In FIG. 17, a magnet 102 including one or more pairs of N and S poles alternately arranged in a ring shape is shown as an example of means for generating a rotating magnetic field whose direction rotates. In the example shown in FIG. 17, the magnet 102 includes two pairs of N and S poles. The rotating field sensor 1 according to the fourth embodiment is configured to detect the direction of the rotating magnetic field generated from the outer periphery of the magnet 102. In the example shown in FIG. 17, the plane of the drawing of FIG. 17 is an XY plane, and a direction perpendicular to the plane is the Z direction. The N and S poles of the magnet 102 are arranged symmetrically with respect to the center of rotation parallel to the Z direction. The magnet 102 rotates about the center of rotation. As a result, a rotating magnetic field occurs on the basis of the magnetic field generated by the magnet 102. The rotating magnetic field rotates about the center of rotation (the Z direction). In the example shown in FIG. 17, the magnet 102 rotates in a clockwise direction, and the rotating magnetic field rotates in a counterclockwise direction.

In the fourth embodiment, the first position P1 where the first detection circuit 10 detects the rotating magnetic field, the second position P2 where the second detection circuit 20 detects the rotating magnetic field, the third position P3 where the third detection circuit 30 detects the rotating magnetic field, and the fourth position P4 where the fourth detection circuit 40 detects the rotating magnetic field are the same in the direction of rotation of the magnet 102. Thus, in the fourth embodiment the first to fourth detection circuits 10, 20, 30 and 40 are located in the same position in the direction of rotation of the magnet 102.

In the example shown in FIG. 17, the first direction D1, which is a direction of the rotating magnetic field that maximizes the first output signal S1 generated by the first detection circuit 10, is set in a radial direction of the magnet 102. The second direction D2, which is a direction of the rotating magnetic field that maximizes the second output signal S2 generated by the second detection circuit 20, is the direction rotated counterclockwise by $\theta 2$ from the first direction D1 in the XY plane. The third direction D3, which is a direction of the rotating magnetic field that maximizes the third output signal S3 generated by the third detection circuit 30, is the direction rotated counterclockwise by $\theta 3$ from the first direction D1 in the XY plane. The fourth direction D4, which is a direction of the rotating magnetic field that maximizes the fourth output signal S4 generated by the fourth detection circuit 40, is the direction rotated counterclockwise by $\theta 4$ from the first direction D1 in the XY plane. In the fourth embodiment, $\theta 2$, $\theta 3$ and $\theta 4$ are specifically 45°, 90° and 135°, respectively.

The rotating field sensor 1 shown in FIG. 17 is otherwise configured in the same manner as any of the first to third embodiments.

Modification Example

Figure 18:
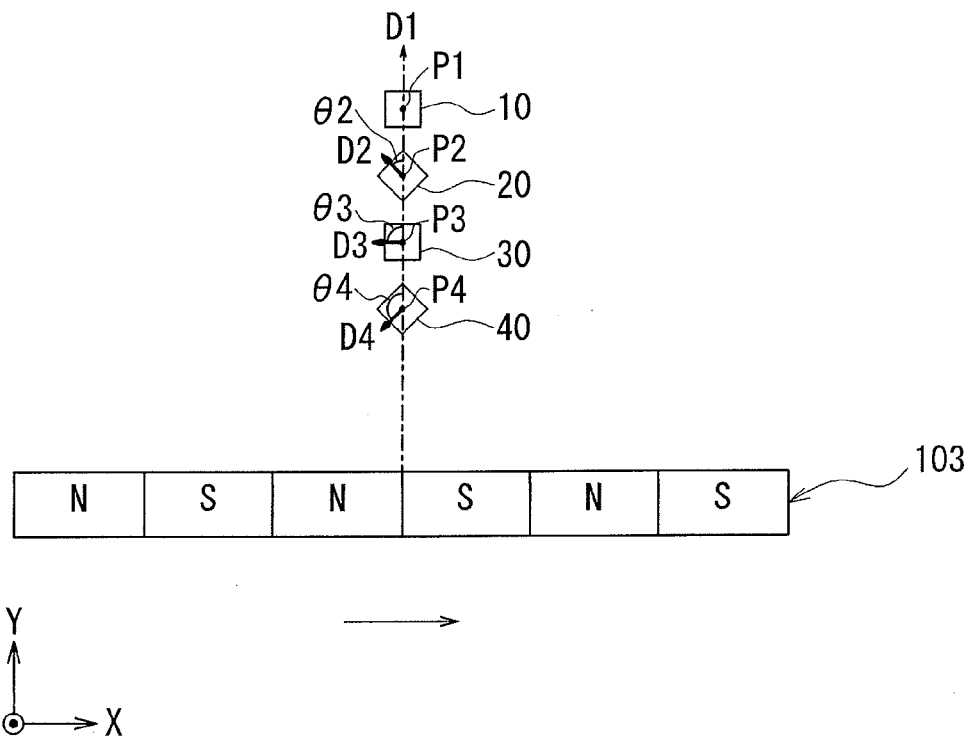
FIG. 18 is an explanatory diagram illustrating the configuration of a rotating field sensor of a modification example of the fourth embodiment of the invention.

A modification example of the fourth embodiment will now be described with reference to FIG. 18. FIG. 18 is an explanatory diagram illustrating the configuration of a rotating field sensor of the modification example of the fourth embodiment. In FIG. 18, a magnet 103 including a plurality of pairs of N and S poles alternately arranged in a linear configuration is shown as an example of means for generating a rotating magnetic field whose direction rotates. The rotating field sensor 1 of the modification example is configured to detect the direction of the rotating magnetic field generated from the outer periphery of the magnet 103. In the example shown in FIG. 18, the plane of the drawing of FIG. 18 is the XY plane, and a direction perpendicular to the plane is the Z direction. The magnet 103 moves linearly in its longitudinal direction in response to a linear movement of an object. As a result, a rotating magnetic field occurs on the basis of the magnetic field generated by the magnet 103. The rotating magnetic field rotates about the Z direction.

In the example shown in FIG. 18, the first direction D1 is set in a direction orthogonal to the direction of movement of the magnet 103 in the XY plane. The second direction D2 is the direction rotated counterclockwise by θ2, that is, 45°, from the first direction D1 in the XY plane. The third direction D3 is the direction rotated counterclockwise by θ3, that is, 90°, from the first direction D1 in the XY plane. The fourth direction D4 is the direction rotated counterclockwise by θ4, that is, 135°, from the first direction D1 in the XY plane. The rotating field sensor 1 shown in FIG. 18 is otherwise configured in the same manner as the rotating field sensor 1 shown in FIG. 17.

For the sake of convenience, in FIG. 17 and FIG. 18 the first to fourth detection circuits 10, 20, 30 and 40 are depicted as being spaced from each other in the Y direction. However, the locations of the first to fourth detection circuits 10, 20, 30 and 40 in the Y direction are preferably close to each other, and more preferably identical with each other.

The other configuration, operation, and effects of the fourth embodiment are the same as those of any of the first to third embodiments.

Fifth Embodiment

Figure 19:
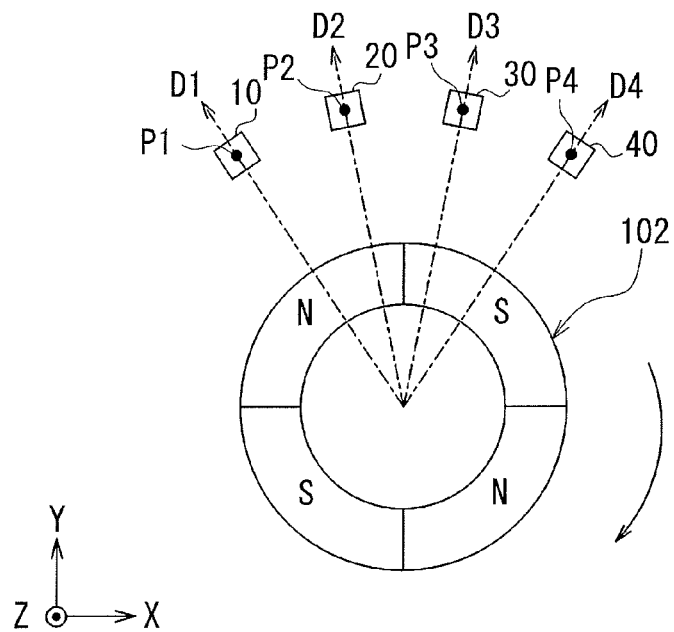
FIG. 19 is an explanatory diagram illustrating the configuration of a rotating field sensor according to a fifth embodiment of the invention.

A rotating field sensor according to a fifth embodiment of the invention will now be described with reference to FIG. 19. FIG. 19 is an explanatory diagram illustrating the configuration of the rotating field sensor according to the fifth embodiment. The rotating field sensor 1 according to the fifth embodiment is configured to detect the direction of a rotating magnetic field generated from the outer periphery of the magnet 102, as in the example of the fourth embodiment shown in FIG. 17. In the rotating field sensor 1 according to the fifth embodiment, the first position P1 where the first detection circuit 10 detects the rotating magnetic field, the second position P2 where the second detection circuit 20 detects the rotating magnetic field, the third position P3 where the third detection circuit 30 detects the rotating magnetic field, and the fourth position P4 where the fourth detection circuit 40 detects the rotating magnetic field are different from each other in the direction of rotation of the magnet 102. More specifically, in the fifth embodiment, the first to fourth detection circuits 10, 20, 30 and 40 are located at different positions in the direction of rotation of the magnet 102.

In the example shown in FIG. 19, the magnet 102 includes two pairs of N and S poles. The rotating magnetic field makes two rotations during one rotation of the magnet 102. In this case, one period of the first to fourth output signals S1 to S4, i.e., an electrical angle of 360°, is equivalent to a one-half rotation of the magnet 102, i.e., a 180-degree angle of rotation of the magnet 102. In FIG. 19, the difference between the first position P1 and the second position P2, the difference between the second position P2 and the third position P3, and the difference between the third position P3 and the fourth position P4 are all 45° in electrical angle, i.e., 22.5° in the angle of rotation of the magnet 102. Further, the difference between the first position P1 and the third position P3 is 90° in electrical angle, i.e., 45° in the angle of rotation of the magnet 102, and the difference between the first position P1 and the fourth position P4 is 135° in electrical angle, i.e., 67.5° in the angle of rotation of the magnet 102.

In the example shown in FIG. 19, the first direction D1 which is a direction of the rotating magnetic field that maximizes the first output signal S1 generated by the first detection circuit 10, the second direction D2 which is a direction of the rotating magnetic field that maximizes the second output signal S2 generated by the second detection circuit 20, the third direction D3 which is a direction of the rotating magnetic field that maximizes the third output signal S3 generated by the third detection circuit 30, and the fourth direction D4 which is a direction of the rotating magnetic field that maximizes the fourth output signal S4 generated by the fourth detection circuit 40 are all set in radial directions of the magnet 102. The rotating field sensor 1 shown in FIG. 19 is otherwise configured in the same manner as any of the first to third embodiments.

Modification Example

Figure 20:
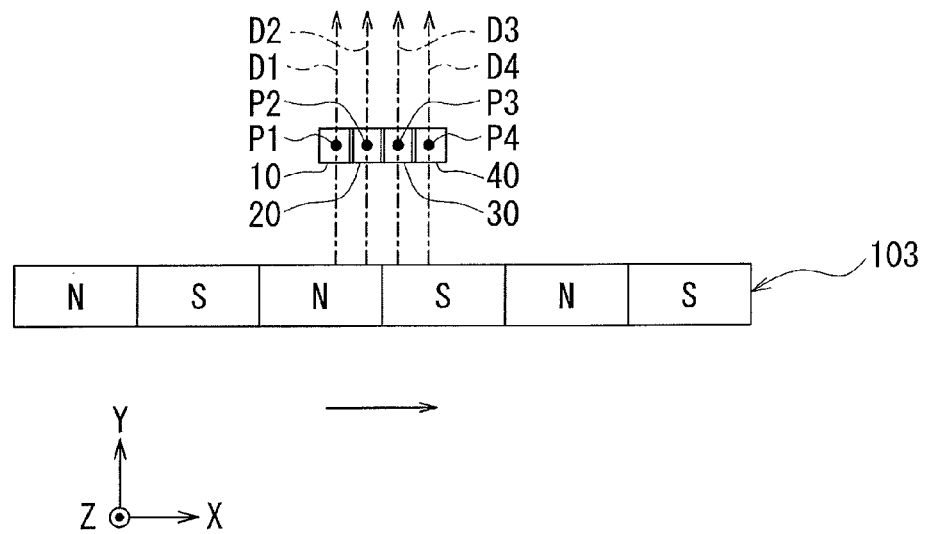
FIG. 20 is an explanatory diagram illustrating the configuration of a rotating field sensor of a modification example of the fifth embodiment of the invention.

A modification example of the fifth embodiment will now be described with reference to FIG. 20. FIG. 20 is an explanatory diagram illustrating the configuration of a rotating field sensor of the modification example of the fifth embodiment. The rotating field sensor 1 of the modification example is configured to detect the direction of a rotating magnetic field generated from the outer periphery of the magnet 103, as in the example of the fourth embodiment shown in FIG. 18. In the example shown in FIG. 20, the rotating magnetic field makes one rotation while the magnet 103 moves by one pitch, i.e., as much as a pair of N and S poles. In this case, one period of the first to fourth output signals S1 to S4, i.e., 360° in electrical angle, is equivalent to one pitch of the magnet 103. In FIG. 20, the difference between the first position P1 and the second position P2, the difference between the second position P2 and the third position P3, and the difference between the third position P3 and the fourth position P4 are all ⅛ pitch. Further, the difference between the first position P1 and the third position P3 is ¼ pitch, and the difference between the first position P1 and the fourth position P4 is ⅜ pitch.

In the example shown in FIG. 20, the first to fourth directions D1 to D4 are all set in a direction orthogonal to the direction of movement of the magnet 103 in the XY plane. The rotating field sensor 1 shown in FIG. 20 is otherwise configured in the same manner as the rotating field sensor 1 shown in FIG. 19.

The other configuration, operation, and effects of the fifth embodiment are the same as those of any of the first to fourth embodiments.

Sixth Embodiment

A rotating field sensor according to a sixth embodiment of the invention will now be described. The rotating field sensor 1 according to the sixth embodiment satisfies requirements 1 to 4 described in the first embodiment section. The rotating field sensor 1 according to the sixth embodiment may further satisfy requirements 5 and 6 described in the first embodiment section. Differences of the rotating field sensor 1 according to the sixth embodiment from the rotating field sensor 1 according to the first embodiment will be described below. Like the rotating field sensor 1 according to the first embodiment, the rotating field sensor 1 according to the sixth embodiment includes an angle determination unit configured to determine the angle detection value θs by using g angle values. In the sixth embodiment, however, the configuration and operation of the angle determination unit are different from those in the first embodiment.

The angle determination unit of the sixth embodiment determines the angle detection value θs repeatedly at predetermined time intervals dt, and generates an estimated value θsd for a next-to-be-determined angle detection value θs on the basis of a plurality of angle detection values θs already determined. In the case of a failure of one of the n detection circuits, if a plurality of correct angle values corresponding to a plurality of ones of the g groups that do not include the failed detection circuit are identifiable from the g angle values, the angle determination unit determines the angle detection value θs on the basis of at least one of the plurality of correct angle values. If the plurality of correct angle values are not identifiable from the g angle values, the angle determination unit determines the estimated value θsd to be the angle detection value θs.

The angle determination unit may include an angle difference calculation unit, a provisional normal angle value determination unit, and an angle output unit. Like the first embodiment, the angle difference calculation unit calculates at least g angle differences for respective at least g angle value pairs each consisting of two angle values selected from the g angle values. Each of the at least g angle differences is a difference between the two angle values constituting a corresponding one of the at least g angle value pairs. The provisional normal angle value determination unit extracts one or more angle differences that fall within a predetermined range from the at least g angle differences, and determines a plurality of angle values constituting one or more angle value pairs corresponding to the extracted one or more angle differences to be a plurality of provisional normal angle values. The angle output unit determines and outputs the angle detection value θs repeatedly at predetermined time intervals dt.

The angle output unit includes an angle value estimation unit and an angle detection value determination unit. The angle value estimation unit generates the estimated value θsd for the next-to-be-determined angle detection value θs on the basis of the plurality of angle detection values θs already determined. In the case of a failure of one of the n detection circuits, if a plurality of correct angle values corresponding to a plurality of ones of the g groups that do not include the failed detection circuit are identifiable from the plurality of provisional normal angle values, the angle detection value determination unit determines the angle detection value θs on the basis of at least one of the plurality of correct angle values. If the plurality of correct angle values are not identifiable from the plurality of provisional normal angle values, the angle detection value determination unit determines the estimated value θsd to be the angle detection value θs. Each of the g angle values is used to constitute at least two of the at least g angle value pairs.

Figure 21:
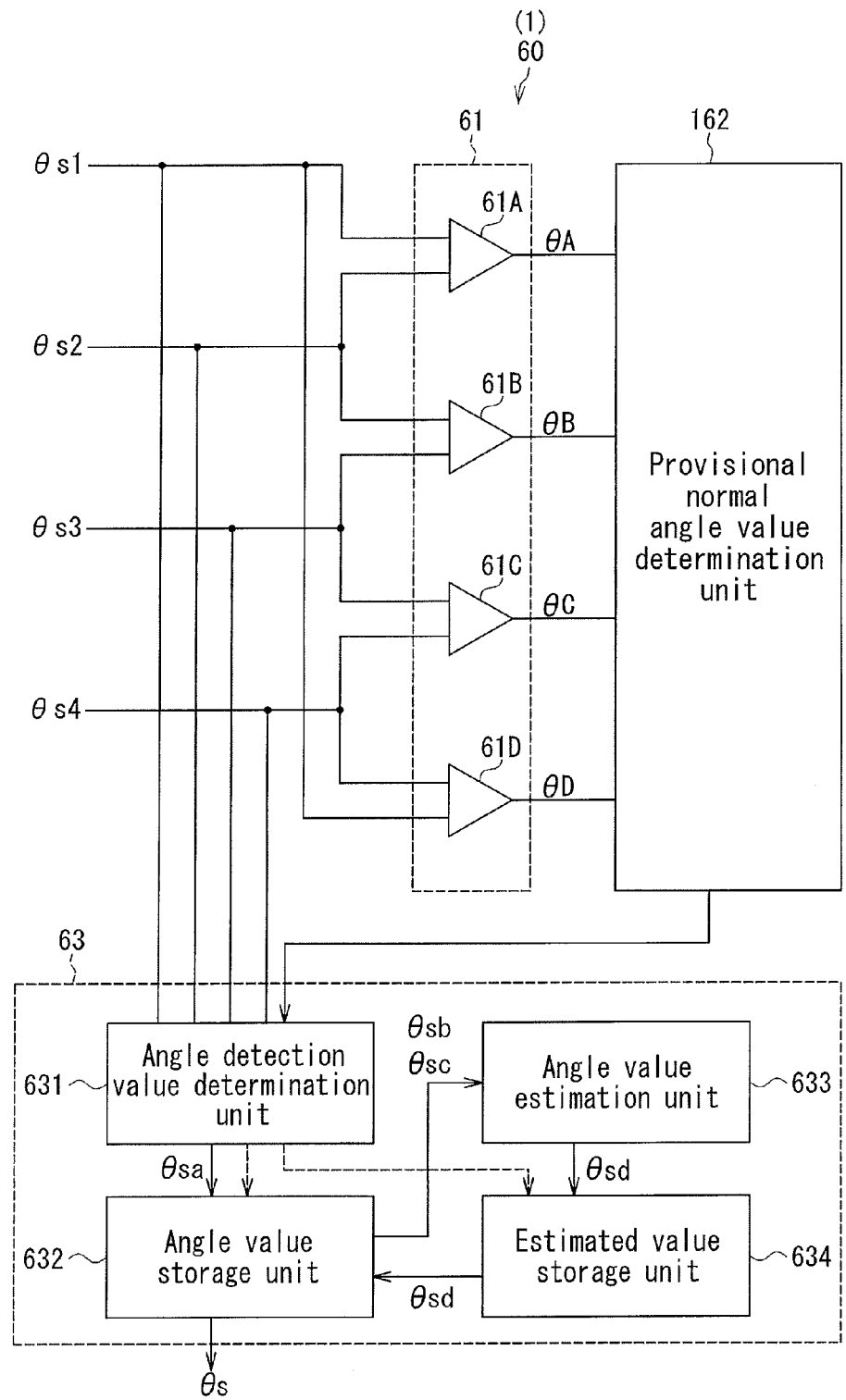
FIG. 21 is a circuit diagram illustrating a portion of a rotating field sensor according to a sixth embodiment of the invention.

A practical example of the rotating field sensor 1 according to the sixth embodiment will now be described with reference to FIG. 21. FIG. 21 is a circuit diagram illustrating a portion of the rotating field sensor 1 according to the sixth embodiment. Hereinafter, the rotating field sensor 1 of this practical example will be referred to as the rotating field sensor 1 of the third practical example. The rotating field sensor 1 of the third practical example has the same configuration as that of the rotating field sensor 1 of the first or second practical example described in the first embodiment section except for the following differences. The control unit 60 of the third practical example includes a provisional normal angle value determination unit 162 in place of the determination unit 62 of the first or second practical example. The configuration and operation of the provisional normal angle value determination unit 162 are the same as those of the determination unit 62 of the first or second practical example. However, the provisional normal angle value determination unit 162 extracts a plurality of provisional normal angle values to be described later, instead of a plurality of correct angle values. Further, the angle output unit 63 of the third practical example differs from that of the first or second practical example in configuration. The configuration of the angle output unit 63 of the third practical example will be described below.

The angle output unit 63 of the third practical example includes an angle detection value determination unit 631, an angle value storage unit 632, an angle value estimation unit 633, and an estimated value storage unit 634. The angle detection value determination unit 631 and the angle value estimation unit 633 are implemented by software, not by physically separate elements. The angle value storage unit 632 and the estimated value storage unit 634 are implemented by a random access memory (RAM) of a microcomputer, for example.

The angle detection value determination unit 631 receives the four angle values θs1 to θs4 input to the four inputs of the angle output unit 63. In the third practical example, the provisional normal angle value determination unit 162 extracts a plurality of provisional normal angle values from the four angle values θs1 to θs4. The plurality of provisional normal angle values may include not only a plurality of originally correct angle values but also a plurality of incorrect angle values that are not distinguishable from the correct angle values. A method for extracting the plurality of provisional normal angle values will be described later.

The angle detection value determination unit 631 is controlled by the provisional normal angle value determination unit 162 to determine whether a plurality of correct angle values are identifiable from the plurality of provisional normal angle values. If a plurality of correct angle values are identifiable, the angle detection value determination unit 631 determines the angle detection value θs on the basis of the plurality of provisional normal angle values by, for example, a method similar to the method by which the angle output unit 63 determines the angle detection value θs in steps S102C and S102F described in the first embodiment section. The angle detection value θs determined thus will be referred to as the actual angle detection value θsa. The actual angle detection value θsa is stored in the angle value storage unit 632.

In the third practical example, the angle output unit 63 repeatedly performs a series of steps for determining the angle detection value θs to determine and output the angle detection value θs repeatedly at predetermined time intervals dt. The latest one of the repeatedly-determined angle detection values θs will be referred to as the current angle value. One or more past angle detection values θs will be referred to as previous angle value(s). The current angle value θsb and the one or more previous angle values θsc are stored in the angle value storage unit 632.

The angle value estimation unit 633 generates the estimated value θsd for the next-to-be-determined angle detection value θs on the basis of the plurality of angle detection values θs already determined. Specifically, the angle value estimation unit 633 estimates an angle detection value θs to be determined next after the current angle value θsb by performing the series of steps described above, on the basis of the current angle value θsb and the one or more previous angle values θsc stored in the angle value storage unit 632. The angle detection value θs estimated thus is the estimated value θsd mentioned above. The estimated value θsd is obtained by, for example, determining an approximation expression including an angle value as a dependent variable by linear approximation on the basis of the current angle value θsb and the one or more previous angle values θsc. The estimated value θsd is stored in the estimated value storage unit 634.

The angle detection value determination unit 631 controls the angle value storage unit 632 and the estimated value storage unit 634 to store the actual angle detection value θsa or the estimated value θsd as the current angle value θsb in the angle value storage unit 632. The angle detection value determination unit 631 further makes the angle value storage unit 632 output the current angle value θsb stored in the angle value storage unit 632 as the angle detection value θs for the angle output unit 63 to output. The step of storing the actual angle detection value θsa or the estimated value θsd as the current angle value θsb will be described later.

An angle determination method according to the sixth embodiment will now be described. The angle determination method according to the sixth embodiment satisfies requirements 1 to 4 described in the first embodiment section. The angle determination method according to the sixth embodiment may further satisfy requirements 5 and 6 described in the first embodiment section. Differences of the angle determination method according to the sixth embodiment from the angle determination method according to the first embodiment will be described below. In the angle determination method according to the sixth embodiment, the second step differs from that in the first embodiment. In the sixth embodiment, the second step determines the angle detection value θs repeatedly at predetermined time intervals dt, and generates an estimated value θsd for a next-to-be-determined angle detection value θs on the basis of a plurality of angle detection values θs already determined. In the case of a failure of one of the n detection circuits, if a plurality of correct angle values corresponding to a plurality of ones of the g groups that do not include the failed detection circuit are identifiable from the g angle values, the second step determines the angle detection value θs on the basis of at least one of the plurality of correct angle values. If the plurality of correct angle values are not identifiable from the g angle values, the second step determines the estimated value θsd to be the angle detection value θs.

In the sixth embodiment, the second step includes: a step of calculating at least g angle differences for respective at least g angle value pairs each consisting of two angle values selected from the g angle values, each of the at least g angle differences being a difference between the two angle values constituting a corresponding one of the at least g angle value pairs; a step of extracting one or more angle differences that fall within a predetermined range from the at least g angle differences, and determining a plurality of angle values constituting one or more angle value pairs corresponding to the extracted one or more angle differences to be a plurality of provisional normal angle values; and an angle detection value determination step of determining the angle detection value θs repeatedly at predetermined time intervals dt. The angle detection value determination step includes: a step of generating the estimated value θsd for the next-to-be-determined angle detection value θs on the basis of the plurality of angle detection values θs already determined; and a step of, in the case of a failure of one of the n detection circuits, determining the angle detection value θs on the basis of at least one of a plurality of correct angle values corresponding to a plurality of ones of the g groups that do not include the failed detection circuit if the plurality of correct angle values are identifiable from the plurality of provisional normal angle values, or determining the estimated value θsd to be the angle detection value θs if the plurality of correct angle values are not identifiable from the plurality of provisional normal angle values.

A practical example of the angle determination method according to the sixth embodiment will now be described. Hereinafter, the angle determination method of this practical example will be referred to as the angle determination method of the third practical example. The angle determination method of the third practical example uses the rotating field sensor 1 of the third practical example.

The angle determination method of the third practical example includes a first step and a second step. The first step of the angle determination method of the third practical example is the same as the first step S101 (see FIG. 7 and FIG. 8) of the angle determination method of each of the first and second practical examples described in the first embodiment section. The second step of the angle determination method of the third practical example is the step in which the control unit 60 shown in FIG. 21 determines the angle detection value θs by using the four angle values θs1 to θs4.

The second step of the angle determination method of the third practical example includes: a step of calculating four angle differences θA to θD; a step of extracting a plurality of provisional normal angle values by using the four angle differences θA to θD; and an angle detection value determination step of determining the angle detection value θs repeatedly at predetermined time intervals dt. The step of calculating the four angle differences θA to θD is the same as step S102A (see FIG. 7) described in the first embodiment section. The step of extracting a plurality of provisional normal angle values extracts a plurality of provisional normal angle values by using the same method as that of step S102B (see FIG. 7) or step S102E (see FIG. 8) described in the first embodiment section. If the step of extracting a plurality of provisional normal angle values uses the same method as that of step S102B to extract a plurality of provisional normal angle values, the plurality of provisional normal angle values correspond to the plurality of correct angle values extracted in step S102B. If the step of extracting a plurality of provisional normal angle values uses the same method as that of step S102E to extract a plurality of provisional normal angle values, then like step S102E, all incorrect angle values are extracted to identify the failed detection circuit, and all angle values other than all the incorrect angle values are determined to be the plurality of provisional normal angle values. The step of extracting a plurality of provisional normal angle values is performed by the provisional normal angle value determination unit 162.

Figure 22:
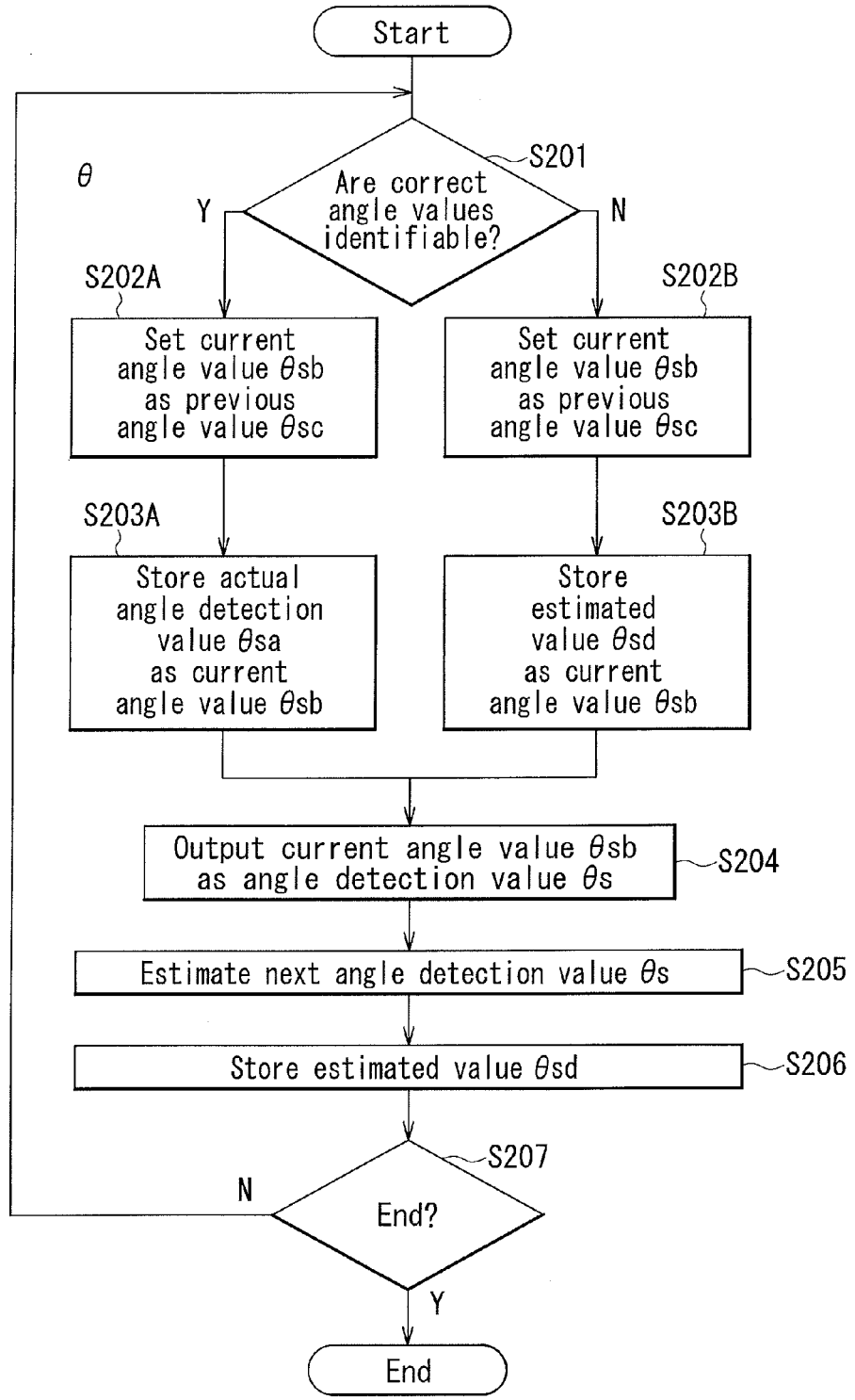
FIG. 22 is a flowchart illustrating an angle detection value determination step in the sixth embodiment of the invention.

The angle detection value determination step of the angle determination method of the third practical example and the operations of the angle detection value determination unit 631, the angle value storage unit 632, the angle value estimation unit 633 and the estimated value storage unit 634 will now be described with reference to FIG. 21 and FIG. 22. FIG. 22 is a flowchart illustrating the angle detection value determination step.

The angle detection value determination step starts with step S201 in which the angle detection value determination unit 631 determines whether a plurality of correct angle values are identifiable from the plurality of provisional normal angle values. If none of the first to fourth detection circuits 10, 20, 30 and 40 (see FIG. 3) of the rotating field sensor 1 fails, the plurality of provisional normal angle values are all identical with or very close to each other. In such a case, the angle detection value determination unit 631 determines that a plurality of correct angle values are identifiable.

If one of the first to fourth detection circuits 10, 20, 30 and 40 fails, among the four angle values θs1 to θs4, two angle values corresponding to two groups that include the failed detection circuit become incorrect angle values. In this case, a plurality of provisional normal angle values extracted at certain timing can include such two incorrect angle values, in addition to a plurality of originally correct angle values. More specifically, if an angle difference calculated for an angle value pair consisting of two incorrect angle values has a value of zero or a value very close to zero at certain timing, such two incorrect angle values are extracted as a plurality of provisional normal angle values.

Even if a plurality of provisional normal angle values include incorrect angle values, the incorrect angle values can safely be regarded as correct angle values, provided that all the plurality of provisional normal angle values are identical with or very close to each other. In such a case, the angle detection value determination unit 631 determines that a plurality of correct angle values are identifiable.

On the other hand, if all the plurality of provisional normal angle values are neither identical with nor very close to each other, correct angle values and incorrect ones in the plurality of provisional normal angle values are not distinguishable from each other. In such a case, the angle detection value determination unit 631 determines that a plurality of correct angle values are not identifiable.

If it is determined in step S201 that a plurality of correct angle values are identifiable (Y in step S201), then in step S202A the angle detection value determination unit 631 controls the angle value storage unit 632 so that the current angle value θsb stored therein is set as a previous angle value θsc. Next, in step S203A, the angle detection value determination unit 631 determines the actual angle detection value θsa, and further, controls the angle value storage unit 632 to store the actual angle detection value θsa in the angle value storage unit 632 as the current angle value θsb.

If it is determined in step S201 that a plurality of correct angle values are not identifiable (N in step S201), then in step S202B the angle detection value determination unit 631 controls the angle value storage unit 632 so that the current angle value θsb stored therein is set as a previous angle value θsc. Next, in step S203B, the angle detection value determination unit 631 controls the angle value storage value 632 and the estimated value storage unit 634 so that the estimated value θsd stored in the estimated value storage unit 634 is stored in the angle value storage unit 632 as the current angle value θsb.

After the execution of step S203A or S203B, in step S204 the angle detection value determination unit 631 makes the angle value storage unit 632 output the current angle value θsb stored in the angle value storage unit 632 as the angle detection value θs for the angle output unit 63 to output. In this step S204, either the actual angle detection value θsa stored in step S203A or the estimated value θsd stored in step S203B is output as the angle detection value θs.

Next, in step S205, on the basis of the current angle value θsb and the one or more previous angle values θsc stored in the angle value storage unit 632, the angle value estimation unit 633 estimates the angle detection value θs to be determined next after the current angle value θsb, and thereby generates the estimated value θsd. Next, in step S206, the angle detection value determination unit 631 controls the estimated value storage unit 634 to store the estimated value θsd in the estimated value storage unit 634.

Next, in step S207, the angle detection value determination unit 631 determines whether to end the angle detection value determination step. If it is determined in step S207 that the angle detection value determination step is to be ended (Y), the angle detection value determination unit 631 ends the angle detection value determination step. For example, the angle detection value determination step is ended by input of a signal instructing an end to the angle detection value determination unit 631. If it is determined in step S207 that the angle detection value determination step is not to be ended (N), the angle detection value determination unit 631 returns to step S201. In such a manner, the angle detection value θs is repeatedly determined and output from the angle output unit 63 at predetermined time intervals dt.

In the angle determination method of the third practical example, the angle detection value determination step is predicated on that the current angle value θsb and the one or more previous angle values θsc are stored in the angle value storage unit 632 and the estimated value θsd is stored in the estimated value storage unit 634. Thus, the following preparation step may be performed before the execution of the angle detection value determination step. In the preparation step, first, the angle detection value determination unit 631 determines the actual angle detection value θsa on the basis of a plurality of provisional normal angle values. If all the plurality of provisional normal angle values are neither identical with nor very close to each other and therefore the actual angle detection value θsa is not determinable, the angle detection value determination unit 631 may repeat the step of determining the actual angle detection value θsa until a plurality of provisional normal angle values all become identical with or very close to each other. Once the actual angle detection value θsa has been determined, the determined actual angle detection value θsa is stored in the angle value storage unit 632 as the current angle value θsb.

In the preparation step, the angle detection value determination unit 631 then determines a new actual angle detection value θsa on the basis of a plurality of new provisional normal angle values. Next, the current angle value θsb is set as a previous angle value θsc and the new actual angle detection value θsa is stored as the current angle value θsb in the angle value storage unit 632. Next, like steps S205 and S206, an estimated value θsd is generated on the basis of the current angle value θsb and one or more previous angle values θsc, and stored. By performing such a preparation step, the current angle value θsb and the one or more previous angle values θsc are stored in the angle value storage unit 632, and the estimated value θsd is stored in the estimated value storage unit 634. This completes the preparations to execute the angle detection value determination step. The preparation step is performed, for example, immediately after the rotating field sensor 1 starts the detection of the angle θ.

As described above, according to the sixth embodiment, if an angle difference calculated for an angle value pair consisting of two incorrect angle values has a value of zero or a value very close to zero at certain timing and it is thus impossible to identify a plurality of correct angle values, the estimated value θsd is output as the angle detection value θs. Consequently, according to the sixth embodiment, it is always possible to output the angle detection value θs.

The other configuration, operation, and effects of the sixth embodiment are the same as those of the first embodiment.

The present invention is not limited to the foregoing embodiments, and various modifications may be made thereto. For example, the arrangement of the first to fourth detection circuits 10, 20, 30 and 40 and the first to fourth directions D1 to D4 in the foregoing embodiments are illustrative only. Various modifications may be made to the arrangement of the first to fourth detection circuits 10, 20, 30 and 40 and the first to fourth directions D1 to D4 within the scope of the requirements set forth in the claims.

In the second to sixth embodiments, the first to fourth detection circuits 10, 20, 30 and 40 in the rotating field sensor 1 may be replaced with n detection circuits in accordance with any of the examples of groups listed in discussing requirement 5 in the first embodiment section.

Further, in the present invention, the magnetic detection elements are not limited to spin-valve MR elements (GMR elements or TMR elements) as long as the detection circuits including the magnetic detection elements can generate output signals responsive to the direction DM of the rotating magnetic field MF. For example, AMR elements, Hall elements, fluxgate magnetic sensors and the like may be used as the magnetic detection elements.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A rotating field sensor for detecting an angle that a direction of a rotating magnetic field in a reference position forms with respect to a reference direction, the rotating field sensor comprising:
n detection circuits, each of the n detection circuits including at least one magnetic detection element and generating an output signal responsive to the direction of the rotating magnetic field; and
an angle calculation unit configured to calculate g angle values in correspondence to g groups each consisting of m detection circuits selected from the n detection circuits, each of the g angle values having a correspondence relationship with the angle that the direction of the rotating magnetic field in the reference position forms with respect to the reference direction,
where m is an integer not less than two, n is an integer greater than m by two or more, and g is an integer not less than three and not more than $_nC_m$, where $_nC_m$ is the total number of combinations of m detection circuits to be selected from the n detection circuits, wherein the angle calculation unit is configured to calculate each of the g angle values on the basis of m output signals of the m detection circuits constituting a corresponding one of the g groups, and
each of the n detection circuits is used to constitute at least one and not more than (g−2) of the g groups.

2. The rotating field sensor according to claim 1, further comprising an angle determination unit configured to determine, by using the g angle values, an angle detection value to be output from the rotating field sensor, the angle detection value having a correspondence relationship with the angle that the direction of the rotating magnetic field in the reference position forms with respect to the reference direction.

3. The rotating field sensor according to claim 2, wherein, in the case of a failure of one of the n detection circuits, the angle determination unit extracts from the g angle values a plurality of correct angle values corresponding to a plurality of ones of the g groups that do not include the failed detection circuit, and determines the angle detection value on the basis of at least one of the plurality of correct angle values.

4. The rotating field sensor according to claim 3, wherein the angle determination unit includes:
an angle difference calculation unit configured to calculate at least g angle differences for respective at least g angle value pairs each consisting of two angle values selected from the g angle values, each of the at least g angle differences being a difference between the two angle values constituting a corresponding one of the at least g angle value pairs; and
a determination unit configured to extract one or more angle differences that fall within a predetermined range from the at least g angle differences, and to determine a plurality of angle values constituting one or more angle value pairs corresponding to the extracted one or more angle differences to be the plurality of correct angle values, and
each of the g angle values is used to constitute at least two of the at least g angle value pairs.

5. The rotating field sensor according to claim 2, wherein the angle determination unit is configured to determine the angle detection value repeatedly at predetermined time intervals, and to generate an estimated value for a next-to-be-determined angle detection value on the basis of a plurality of angle detection values already determined, and
in the case of a failure of one of the n detection circuits, if a plurality of correct angle values corresponding to a plurality of ones of the g groups that do not include the failed detection circuit are identifiable from the g angle values, the angle determination unit determines the angle detection value on the basis of at least one of the plurality of correct angle values, and if the plurality of correct angle values are not identifiable from the g angle values, the angle determination unit determines the estimated value to be the angle detection value.

6. The rotating field sensor according to claim 5, wherein the angle determination unit includes:
an angle difference calculation unit configured to calculate at least g angle differences for respective at least g angle value pairs each consisting of two angle values selected from the g angle values, each of the at least g angle differences being a difference between the two angle values constituting a corresponding one of the at least g angle value pairs;

a provisional normal angle value determination unit configured to extract one or more angle differences that fall within a predetermined range from the at least g angle differences, and to determine a plurality of angle values constituting one or more angle value pairs corresponding to the extracted one or more angle differences to be a plurality of provisional normal angle values; and an angle output unit configured to determine and output the angle detection value repeatedly at predetermined time intervals, the angle output unit includes:

an angle value estimation unit configured to generate the estimated value; and an angle detection value determination unit configured to, in the case of a failure of one of the n detection circuits, determine the angle detection value on the basis of at least one of the plurality of correct angle values if the plurality of correct angle values are identifiable from the plurality of provisional normal angle values, and determine, if the plurality of correct angle values are not identifiable from the plurality of provisional normal angle values, the estimated value to be the angle detection value, and each of the g angle values is used to constitute at least two of the at least g angle value pairs.

7. The rotating field sensor according to claim 1, wherein g is greater than m by two or more, and is not less than (n−m+1), and the g groups are formed of such combinations of detection circuits that in the case of a failure of whichever one of the n detection circuits, there is no detection circuit other than the failed detection circuit that is included in all ones of the g groups that include the failed detection circuit and included in none of the other ones of the g groups.

8. The rotating field sensor according to claim 7, further comprising a failure detection unit configured to, in the case of a failure of one of the n detection circuits, extract from the g angle values all incorrect angle values corresponding to all the ones of the g groups that include the failed detection circuit, and identify a detection circuit that is included in all ones of the g groups that correspond to all the incorrect angle values and included in none of ones of the g groups that correspond to any angle values other than all the incorrect angle values as the failed detection circuit.

9. The rotating field sensor according to claim 8, wherein the failure detection unit is configured to determine an angle detection value to be output from the rotating field sensor on the basis of one or more angle values other than all the incorrect angle values, the angle detection value having a correspondence relationship with the angle that the direction of the rotating magnetic field in the reference position forms with respect to the reference direction.

10. The rotating field sensor according to claim 8, wherein the failure detection unit includes:

an angle difference calculation unit configured to calculate at least g angle differences for respective at least g angle value pairs each consisting of two angle values selected from the g angle values, each of the at least g angle differences being a difference between the two angle values constituting a corresponding one of the at least g angle value pairs; and a failure determination unit configured to identify the failed detection circuit on the basis of the at least g angle differences, each of the g angle values is used to constitute at least two of the at least g angle value pairs, and the failure determination unit is configured to extract all angle differences that fall within a predetermined range from the at least g angle differences, and to determine all angle values that are not included in any of all angle value pairs corresponding to all the extracted angle differences to be all the incorrect angle values.

11. The rotating field sensor according to claim 1, wherein the at least one magnetic detection element is at least one magnetoresistive element including: a magnetization pinned layer whose magnetization direction is pinned; a free layer whose magnetization direction varies depending on the direction of the rotating magnetic field; and a nonmagnetic layer disposed between the magnetization pinned layer and the free layer.

12. An angle determination method for determining an angle detection value by using a rotating field sensor, the angle detection value having a correspondence relationship with an angle that a direction of a rotating magnetic field in a reference position forms with respect to a reference direction, the rotating field sensor including n detection circuits, each of the n detection circuits including at least one magnetic detection element and generating an output signal responsive to the direction of the rotating magnetic field, the angle determination method comprising:

a first step of calculating g angle values in correspondence to g groups each consisting of m detection circuits selected from the n detection circuits, each of the g angle values having a correspondence relationship with the angle that the direction of the rotating magnetic field in the reference position forms with respect to the reference direction; and a second step of determining the angle detection value by using the g angle values, where m is an integer not less than two, n is an integer greater than m by two or more, and g is an integer not less than three and not more than $_nC_m$, where $_nC_m$ is the total number of combinations of m detection circuits to be selected from the n detection circuits, wherein the first step calculates each of the g angle values on the basis of m output signals of the m detection circuits constituting a corresponding one of the g groups, and each of the n detection circuits is used to constitute at least one and not more than (g−2) of the g groups.

13. The angle determination method according to claim 12, wherein, in the case of a failure of one of the n detection circuits, the second step extracts from the g angle values a plurality of correct angle values corresponding to a plurality of ones of the g groups that do not include the failed detection circuit, and determines the angle detection value on the basis of at least one of the plurality of correct angle values.

14. The angle determination method according to claim 13, wherein the second step includes:

a step of calculating at least g angle differences for respective at least g angle value pairs each consisting of two angle values selected from the g angle values, each of the at least g angle differences being a difference between the two angle values constituting a corresponding one of the at least g angle value pairs; and a step of extracting one or more angle differences that fall within a predetermined range from the at least g angle differences, and determining a plurality of angle values constituting one or more angle value pairs corresponding to the extracted one or more angle differences to be the plurality of correct angle values, and each of the g angle values is used to constitute at least two of the at least g angle value pairs.

15. The angle determination method according to claim 12, wherein the second step determines the angle detection value repeatedly at predetermined time intervals, and generates an estimated value for a next-to-be-determined angle detection value on the basis of a plurality of angle detection values already determined, and in the case of a failure of one of the n detection circuits, the second step determines the angle detection value on the basis of at least one of a plurality of correct angle values corresponding to a plurality of ones of the g groups that do not include the failed detection circuit if the plurality of correct angle values are identifiable from the g angle values, or determines the estimated value to be the angle detection value if the plurality of correct angle values are not identifiable from the g angle values.

16. The angle determination method according to claim 15, wherein the second step includes:

a step of calculating at least g angle differences for respective at least g angle value pairs each consisting of two angle values selected from the g angle values, each of the at least g angle differences being a difference between the two angle values constituting a corresponding one of the at least g angle value pairs;

a step of extracting one or more angle differences that fall within a predetermined range from the at least g angle differences, and determining a plurality of angle values constituting one or more angle value pairs corresponding to the extracted one or more angle differences to be a plurality of provisional normal angle values; and an angle detection value determination step of determining the angle detection value repeatedly at predetermined time intervals, the angle detection value determination step includes:

a step of generating the estimated value; and a step of, in the case of a failure of one of the n detection circuits, determining the angle detection value on the basis of at least one of the plurality of correct angle values if the plurality of correct angle values are identifiable from the plurality of provisional normal angle values, or determining the estimated value to be the angle detection value if the plurality of correct angle values are not identifiable from the plurality of provisional normal angle values, and each of the g angle values is used to constitute at least two of the at least g angle value pairs.

17. The angle determination method according to claim 12, wherein g is greater than m by two or more, and is not less than (n−m+1), and the g groups are formed of such combinations of detection circuits that in the case of a failure of whichever one of the n detection circuits, there is no detection circuit other than the failed detection circuit that is included in all ones of the g groups that include the failed detection circuit and included in none of the other ones of the g groups.

18. The angle determination method according to claim 17, wherein the second step includes, in the case of a failure of one of the n detection circuits, extracting from the g angle values all incorrect angle values corresponding to all the ones of the g groups that include the failed detection circuit, and identifying a detection circuit that is included in all ones of the g groups that correspond to all the incorrect angle values and included in none of ones of the g groups that correspond to any angle values other than all the incorrect angle values as the failed detection circuit.

19. The angle determination method according to claim 18, wherein the second step determines the angle detection value on the basis of one or more angle values other than all the incorrect angle values.

20. The angle determination method according to claim 18, wherein the second step includes:

a step of calculating at least g angle differences for respective at least g angle value pairs each consisting of two angle values selected from the g angle values, each of the at least g angle differences being a difference between the two angle values constituting a corresponding one of the at least g angle value pairs; and a step of identifying the failed detection circuit on the basis of the at least g angle differences, each of the g angle values is used to constitute at least two of the at least g angle value pairs, and the step of identifying the failed detection circuit extracts all angle differences that fall within a predetermined range from the at least g angle differences, and determines all angle values that are not included in any of all angle value pairs corresponding to all the extracted angle differences to be all the incorrect angle values.

21. The angle determination method according to claim 12, wherein the at least one magnetic detection element is at least one magnetoresistive element including: a magnetization pinned layer whose magnetization direction is pinned; a free layer whose magnetization direction varies depending on the direction of the rotating magnetic field; and a nonmagnetic layer disposed between the magnetization pinned layer and the free layer.

* * * * *